(12) United States Patent
Lii et al.

(10) Patent No.: US 11,854,835 B2
(45) Date of Patent: Dec. 26, 2023

(54) HETEROGENEOUS BONDING STRUCTURE AND METHOD FORMING SAME

(71) Applicant: Taiwan Semiconductor Manufacturing Co., Ltd., Hsinchu (TW)

(72) Inventors: Mirng-Ji Lii, Sinpu Township (TW); Chen-Shien Chen, Zhubei (TW); Lung-Kai Mao, Kaohsiung (TW); Ming-Da Cheng, Taoyuan (TW); Wen-Hsiung Lu, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/818,747

(22) Filed: Aug. 10, 2022

(65) Prior Publication Data

US 2022/0384210 A1 Dec. 1, 2022

Related U.S. Application Data

(62) Division of application No. 17/220,339, filed on Apr. 1, 2021.

(Continued)

(51) Int. Cl.
*H01L 21/48* (2006.01)
*H01L 23/498* (2006.01)
(Continued)

(52) U.S. Cl.
CPC ........ *H01L 21/4857* (2013.01); *H01L 21/486* (2013.01); *H01L 21/4853* (2013.01); *H01L 23/49816* (2013.01); *H01L 23/49822* (2013.01); *H01L 23/49838* (2013.01); *H01L 23/5226* (2013.01); *H01L 23/5383* (2013.01);
(Continued)

(58) Field of Classification Search
CPC .................................................. H01L 24/02–09
See application file for complete search history.

(56) References Cited

U.S. PATENT DOCUMENTS 7,897,431 B2 3/2011 Chen et al.
8,809,123 B2 8/2014 Liu et al.
(Continued)

FOREIGN PATENT DOCUMENTS

CN 103474420 A 12/2013
DE 102016117031 A1 7/2017
(Continued)

*Primary Examiner* — Selim U Ahmed
*Assistant Examiner* — Evan G Clinton
(74) *Attorney, Agent, or Firm* — Slater Matsil, LLP

(57) ABSTRACT

A method includes forming a first package component, which formation process includes forming a first plurality of openings in a first dielectric layer, depositing a first metallic material into the first plurality of openings, performing a planarization process on the first metallic material and the first dielectric layer to form a plurality of metal pads in the first dielectric layer, and selectively depositing a second metallic material on the plurality of metal pads to form a plurality of bond pads. The first plurality of bond pads comprise the plurality of metal pads and corresponding parts of the second metallic material. The first package component is bonded to a second package component.

20 Claims, 22 Drawing Sheets

Related U.S. Application Data

(60) Provisional application No. 63/142,543, filed on Jan. 28, 2021.

(51) Int. Cl.
    *H01L 23/522*     (2006.01)
    *H01L 23/538*     (2006.01)
    *H01L 23/00*     (2006.01)

(52) U.S. Cl.
    CPC .... *H01L 24/80* (2013.01); *H01L 2224/80345* (2013.01); *H01L 2224/80355* (2013.01)

(56) References Cited

U.S. PATENT DOCUMENTS

| | | | |
|---|---|---|---|
| 10,790,262 B2 | 9/2020 | Uzoh et al. | |
| 10,854,574 B2 | 12/2020 | Chen et al. | |
| 2013/0320556 A1* | 12/2013 | Liu | H01L 24/92 438/455 |
| 2019/0319007 A1* | 10/2019 | Uzoh | H01L 25/50 |
| 2020/0006288 A1 | 1/2020 | Chen et al. | |
| 2020/0146155 A1 | 5/2020 | Barber | |
| 2021/0098359 A1 | 4/2021 | Vreeland et al. | |
| 2022/0037273 A1* | 2/2022 | Park | H01L 25/0657 |

FOREIGN PATENT DOCUMENTS

| | | |
|---|---|---|
| DE | 102020123400 A1 | 4/2021 |
| JP | 2009188400 A | 8/2009 |
| JP | 2011009489 A | 1/2011 |
| KR | 20190055694 A | 5/2019 |
| TW | 201923918 A | 6/2019 |
| TW | 201944500 A | 11/2019 |

\* cited by examiner

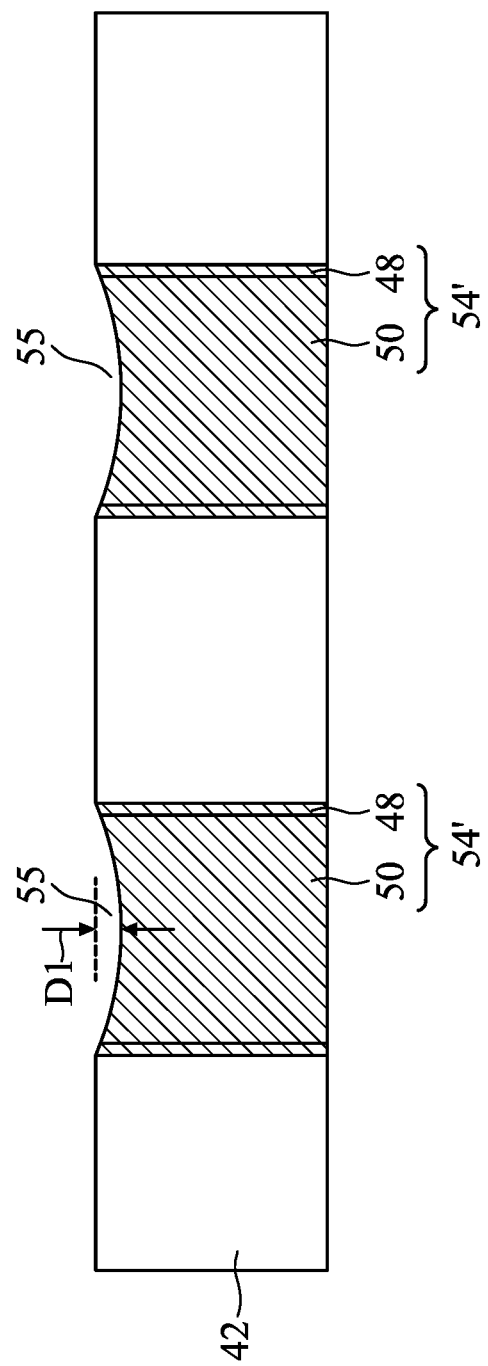

HETEROGENEOUS BONDING STRUCTURE AND METHOD FORMING SAME

PRIORITY CLAIM AND CROSS-REFERENCE

This application is a divisional of U.S. patent application Ser. No. 17/220,339, filed Apr. 1, 2021, and entitled "Heterogeneous Bonding Structure and Method Forming Same," which claims the benefit of the following provisionally filed U.S. Patent Applications: Application No. 63/142,543, filed Jan. 28, 2021, and entitled "New Heterogeneous Bonding Structure for SoIC Application," which applications are hereby incorporated herein by reference.

BACKGROUND

In wafer-to-wafer bonding technology, various methods have been developed to bond two package components (such as wafers) together. The available bonding methods include fusion bonding, eutectic bonding, direct metal bonding, hybrid bonding, and the like. In the hybrid bonding, the metal pads of two wafers are bonded to each other through direct metal-to-metal bonding, and an oxide surface of one of the two wafers is bonded to an oxide surface or a silicon surface of the other wafer.

The wafer-to-wafer bonding has high requirement for the co-planarity of the bonding surfaces of the wafers. For example, the bonding surfaces of the metal pads need to be coplanar with the bonding surfaces of the dielectric layers, so that both of the direct metal-to-metal bonding and the fusion bonding may be achieved. The co-planarity, however, is difficult to achieve. For example, the top surfaces of the wafers are typically planarized through Chemical Mechanical Polish (CMP) processes. The CMP processes, however, suffer from dishing problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 15A, 15B, 16A, 16B, 17, 18A, and 18B illustrate the amplified views of bond pads during bonding processes in accordance with some exemplary embodiments.

DETAILED DESCRIPTION

Figure 1:
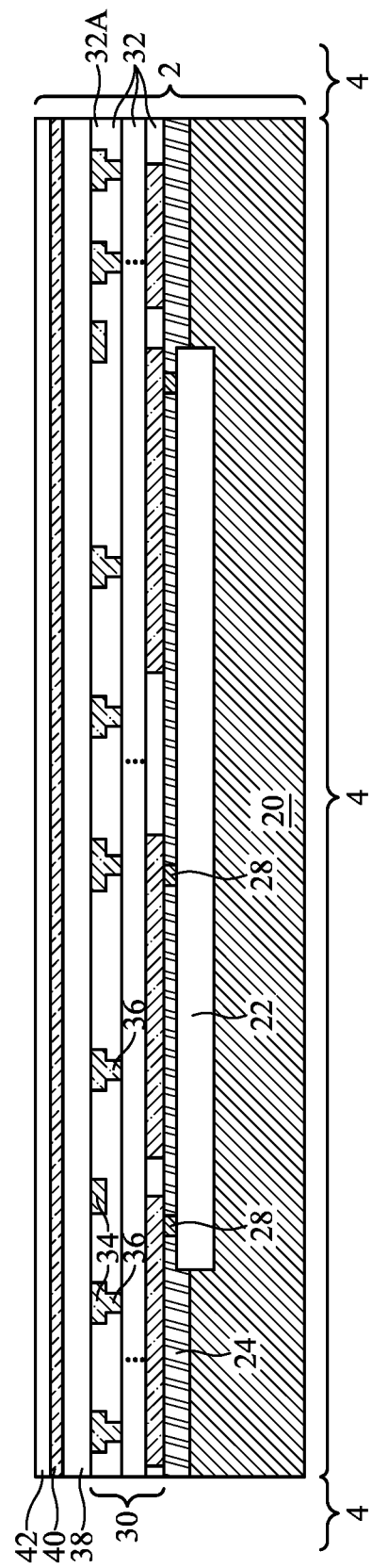
FIGS. 1 through 13 are cross-sectional views of intermediate stages in the formation of a package component using wafer-to-wafer bonding in accordance with some exemplary embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the processes of forming the same are provided. In accordance with some embodiments of the present disclosure, a package component is formed, which includes a surface dielectric layer and metal pads in the surface dielectric layer. A planarization process is performed to level the top surfaces of the surface dielectric layer and the metal pads. A fill-in conductive layer is selectively deposited on the metal pads to fill the recesses in the metal pads, so that in the subsequent bonding of the package component with another package component, a better bonding is achieved. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 19:
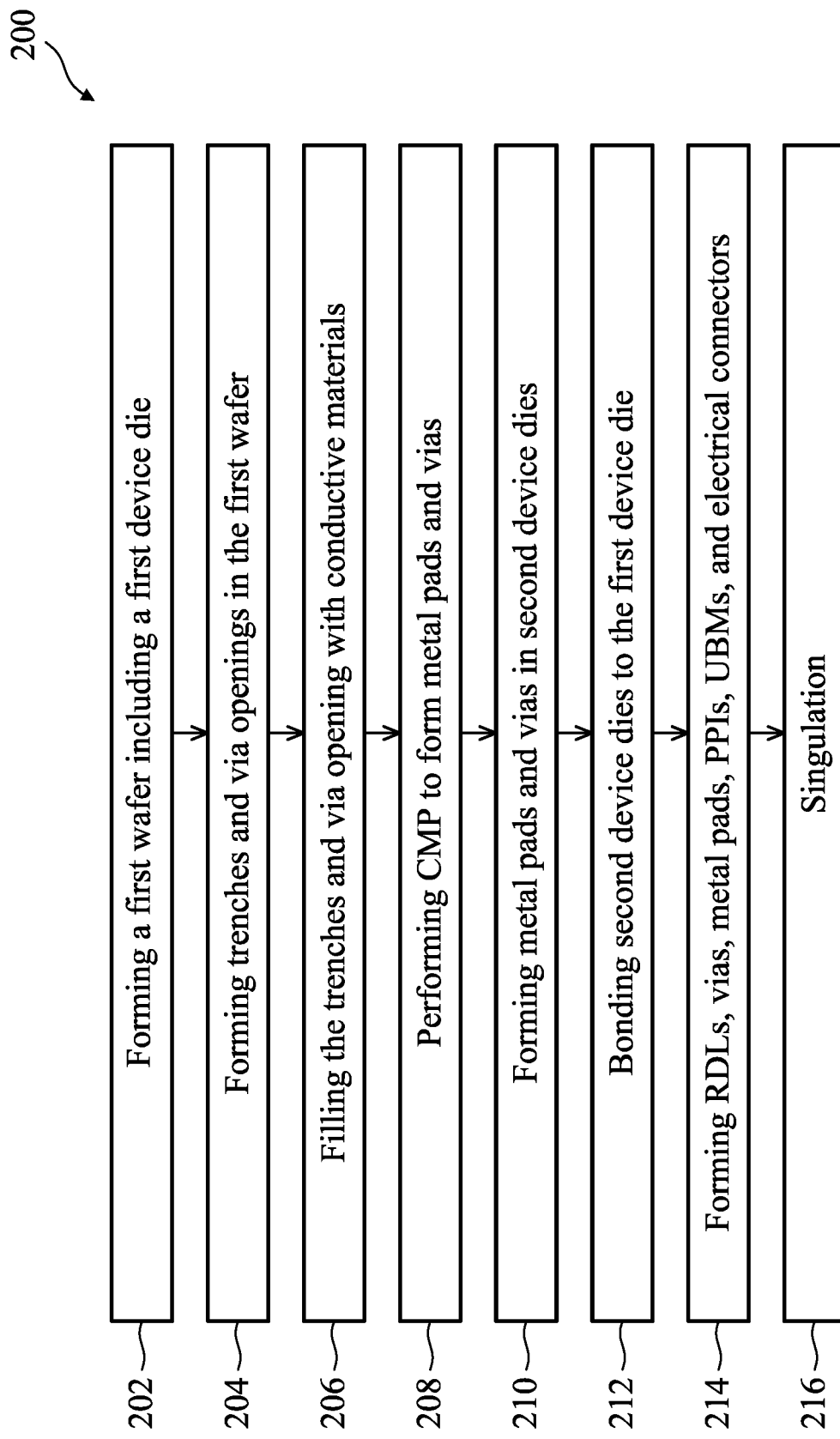
FIG. 19 illustrates a process flow for forming a package in accordance with some embodiments.

FIGS. 1 through 13 illustrate the cross-sectional views of intermediate stages in the formation of a package through a wafer-to-wafer bonding process in accordance with some embodiments of the present disclosure. The respective processes are also reflected schematically in the process flow 200 as shown in FIG. 19.

FIG. 1 illustrates the cross-sectional view in the formation of package component 2. The respective process is illustrated as process 202 in the process flow 200 as shown in FIG. 19. In accordance with some embodiments of the present disclosure, package component 2 is a device wafer including active devices 22 such as transistors and/or diodes, and possibly passive devices such as capacitors, inductors, resistors, or the like. Package component 2 may include a plurality of chips 4 therein, with one of chips 4 illustrated. Chips 4 are alternatively referred to as (device) dies hereinafter. In accordance with some embodiments of the present disclosure, a device die 4 is a logic die, which may be a Central Processing Unit (CPU) die, a Micro Control Unit (MCU) die, an input-output (IO) die, a BaseBand (BB) die, an Application processor (AP) die, or the like. Device die 4 may also be a memory die such as a Dynamic Random Access Memory (DRAM) die or a Static Random Access Memory (SRAM) die.

In accordance with alternative embodiments of the present disclosure, package component 2 is an interposer wafer, which is free from active devices, and may or may not include passive devices. In subsequent discussion, a device wafer is discussed as being the example package component 2, while the embodiments of the present disclosure may also be applied to other types of package components such as interposer wafers. Also, package component 2 may be a reconstructed wafer, which includes discrete device dies encapsulated in an encapsulant such as a molding compound.

In accordance with some embodiments of the present disclosure, the wafer 2 includes semiconductor substrate 20. Semiconductor substrate 20 may be formed of crystalline silicon, crystalline germanium, crystalline silicon germanium, and/or a III-V compound semiconductor such as GaAsP, AlInAs, AlGaAs, GaInAs, GaInP, GaInAsP, and the like. Semiconductor substrate 20 may also be a bulk silicon substrate or a Silicon-On-Insulator (SOI) substrate. Shallow Trench Isolation (STI) regions (not shown) may be formed in semiconductor substrate 20 to isolate the active regions in semiconductor substrate 20. Although not shown, through-vias may be formed to extend into semiconductor substrate 20, and the through-vias are used to electrically inter-couple the features on opposite sides of wafer 2.

In accordance with some embodiments of the present disclosure, wafer 2 includes integrated circuit devices 22, which are formed on the top surface of semiconductor substrate 20. Example integrated circuit devices 22 may include Complementary Metal-Oxide Semiconductor (CMOS) transistors, resistors, capacitors, diodes, and/or the like. The details of integrated circuit devices 22 are not illustrated herein. In accordance with alternative embodiments, wafer 2 is used for forming interposers, in which substrate 20 may be a semiconductor substrate or a dielectric substrate.

Inter-Layer Dielectric (ILD) 24 is formed over semiconductor substrate 20, and fills the space between the gate stacks of transistors (not shown) in integrated circuit devices 22. In accordance with some embodiments, ILD 24 is formed of Phospho Silicate Glass (PSG), Boro Silicate Glass (BSG), Boron-Doped Phospho Silicate Glass (BPSG), Fluorine-Doped Silicate Glass (FSG), silicon oxide, or the like. ILD 24 may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like.

Contact plugs 28 are formed in ILD 24, and are used to electrically connect integrated circuit devices 22 to overlying conductive features. In accordance with some embodiments of the present disclosure, contact plugs 28 are formed of a conductive material selected from tungsten, aluminum, copper, titanium, tantalum, titanium nitride, tantalum nitride, alloys therefore, and/or multi-layers thereof. The formation of contact plugs 28 may include forming contact openings in ILD 24, filling a conductive material(s) into the contact openings, and performing a planarization (such as Chemical Mechanical Polish (CMP) process) to level the top surfaces of contact plugs 28 with the top surface of ILD 24.

Over ILD 24 and contact plugs 28 resides interconnect structure 30. Interconnect structure 30 includes dielectric layers 32, and metal lines 34 and vias 36 formed in dielectric layers 32. Dielectric layers 32 are alternatively referred to as Inter-Metal Dielectric (IMD) layers 32 hereinafter. In accordance with some embodiments of the present disclosure, at least the lower ones of dielectric layers 32 are formed of a low-k dielectric material having a dielectric constant (k-value) lower than about 3.0 or about 2.5. Dielectric layers 32 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 32 are formed of non-low-k dielectric materials such as silicon oxide, silicon carbide (SiC), silicon carbo-nitride (SiCN), silicon oxy-carbo-nitride (SiOCN), or the like. In accordance with some embodiments of the present disclosure, the formation of dielectric layers 32 includes depositing a porogen-containing dielectric material, and then performing a curing process to drive out the porogen, and hence the remaining dielectric layers 32 becomes porous. Etch stop layers (not shown), which may be formed of silicon carbide, silicon nitride, or the like, are formed between IMD layers 32, and are not shown for simplicity.

Metal lines 34 and vias 36 are formed in dielectric layers 32. The metal lines 34 at a same level are collectively referred to as a metal layer hereinafter. In accordance with some embodiments of the present disclosure, interconnect structure 30 includes a plurality of metal layers that are interconnected through vias 36. Metal lines 34 and vias 36 may be formed of copper, aluminum, silver, or the alloys thereof, and they can also be formed of other metals. The formation process may include single damascene and dual damascene processes. In a single damascene process, a trench is first formed in the corresponding dielectric layers 32, followed by filling the trench with a conductive material. A planarization process such as a CMP process is then performed to remove the excess portions of the conductive material higher than the top surface of the IMD layer, leaving a metal line in the trench. In a dual damascene process, both of a trench and a via opening are formed in an IMD layer, with the via opening underlying and connected to the trench. The conductive material is then filled into the trench and the via opening to form a metal line and a via, respectively. The conductive material may include a diffusion barrier and a copper-containing metallic material over the diffusion barrier. The diffusion barrier may include titanium, titanium nitride, tantalum, tantalum nitride, or the like.

Metal lines 34 include metal lines in a top metal layer. The respective dielectric layer 32 (marked as 32A) in which the top metal layer is located may be formed of a non-low-k dielectric material such as Un-doped Silicate Glass (USG), silicon oxide, silicon nitride, or the like. Dielectric layer 32A may also be formed of a low-k dielectric material, which may be selected from the similar materials of the underlying IMD layers 32.

In accordance with some embodiments of the present disclosure, dielectric layers 38 and 42 and etch stop layer 40 are formed over the top metal layer. Dielectric layers 38 and 42 may be formed of silicon oxide, silicon oxynitride, silicon oxy-carbide, or the like. Etch stop layer 40 is formed of a dielectric material different from the dielectric material of etch stop layer 42. For example, dielectric layer 42 may be formed of a silicon-containing dielectric material such as silicon oxide, silicon oxynitride, silicon oxy-carbide, or the like.

Figure 2:
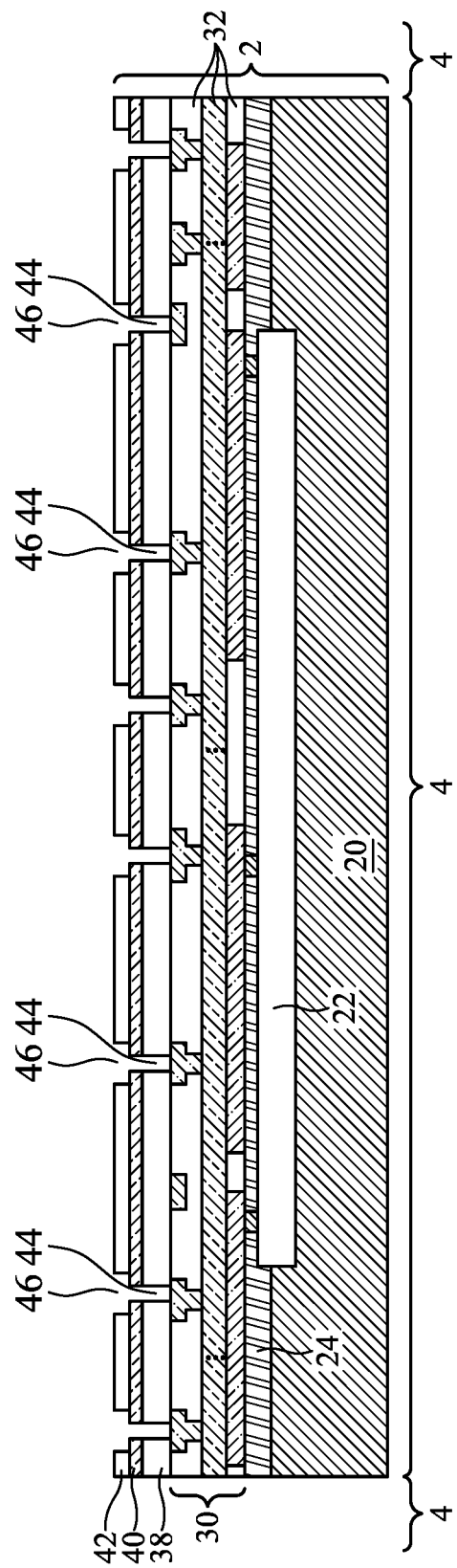

Referring to FIG. 2, via openings 44 and trenches 46 are formed. The respective process is illustrated as process 204 in the process flow 200 as shown in FIG. 19. To form via openings 44 and trenches 46, photo resists (not shown) and/or hard masks (not shown) may be formed and patterned over dielectric layer 42 to define the patterns of via openings 44 and trenches 46. In accordance with some embodiments of the present disclosure, an anisotropic etching process is performed to form trenches 46, and the etch stops on etch stop layer 40. Another anisotropic etch is then performed to form via openings 44 by etching the exposed etch stop layer 40 and the underlying portions of dielectric layer 38. In accordance with some embodiments of the present disclosure, etch stop layer 40 is not formed, and via openings 44 and trenches 46 are formed in a single dielectric layer. The etching may be performed using time-mode to allow the etching (for forming trenches 46) to stop at an intermediate level between a top surface and a bottom surface of the single dielectric layer.

Figure 3:
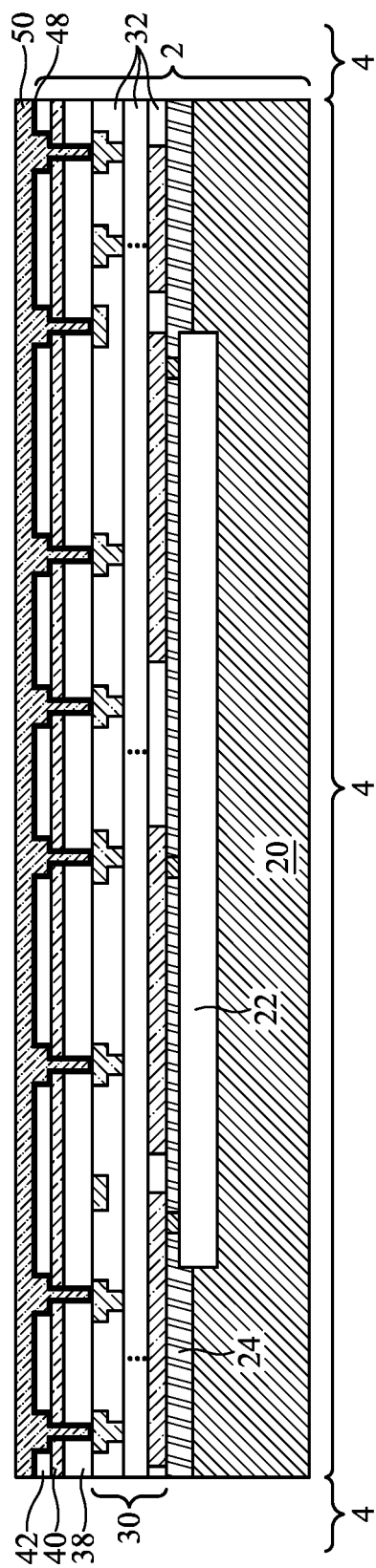

FIG. 3 illustrates the filling of conductive materials. The respective process is illustrated as process 206 in the process flow 200 as shown in FIG. 19. Conductive diffusion barrier 48 is first formed. In accordance with some embodiments of the present disclosure, diffusion barrier 48 is formed of titanium, titanium nitride, tantalum, tantalum nitride, or the like. Diffusion barrier 48 may be formed, for example, using Atomic Layer Deposition (ALD), Physical Vapor Deposition (PVD), or the like. Diffusion barrier 48 comprises first portions over surface dielectric layer 42, and second portions on the bottoms and sidewalls of trenches 46 and via openings 44.

Next, metallic material 50 is deposited, for example, through Electro-Chemical Plating (ECP). Metallic material 50 fills the remaining portions of trenches 46 and via openings 44. Metallic material 50 further includes some portions over the top surface of surface dielectric layer 42. Metallic material 50 may include copper or copper alloy, tungsten, aluminum, silver, alloys thereof, or another metallic material that can diffuse in a subsequent anneal process, so that metal-to-metal direct bonding may be formed.

Figure 4:
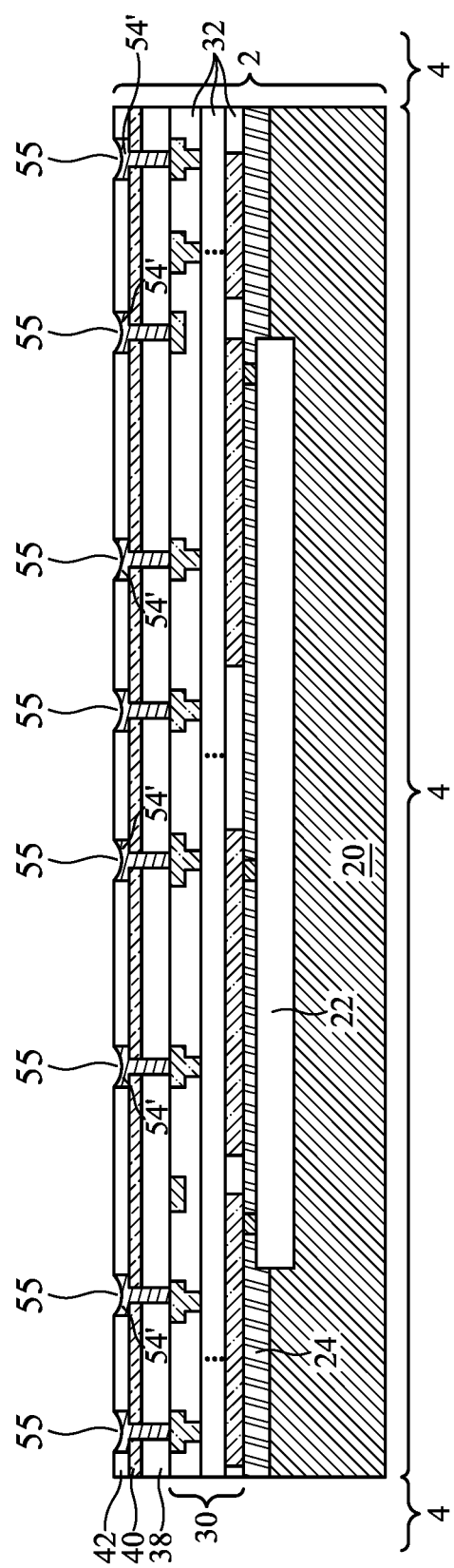

Next, as shown in FIG. 4, a planarization process such as a Chemical Mechanical Polish (CMP) process is performed to remove excess portions of metallic material 50 and diffusion barrier 48, until dielectric layer 42 is exposed. The respective process is illustrated as process 208 in the process flow 200 as shown in FIG. 19. The remaining portions of diffusion barrier 48 and metallic material 50 include vias 52 and metal pads 54'. Throughout the description, metal pads 54' are also referred to as bond pads 54'.

The planarization process is intended to generate a planar top surface, wherein the top surfaces of bond pads 54' and the top surface of dielectric layer 42 are coplanar. Due to various process factors such as pattern-loading effect and the difference between the etching rates and mechanical polishing rates of bond pads 54' and dielectric layer 42, and their different reactions to the slurry, however, non-planar surfaces may be generated. For example, FIG. 4 illustrates the dishing effect occurring during the CMP process, and recesses 55 are formed to extend into metal pads 54'. Also, there may be micro-recesses (roughness) at the top surfaces of bond pads 54'. The roughness of the top surfaces of bond pads 54' may be greater than about 1 µm, which is greater than the maximum allowed roughness for wafer-to-wafer bonding. Accordingly, in accordance with some embodiments, the surfaces of bond pads 54' are deposited with an addition layer to reduce the non-coplanar and roughness problems, as is shown in FIGS. 15A, 15B, 16A, and 16B.

Figure 15B:
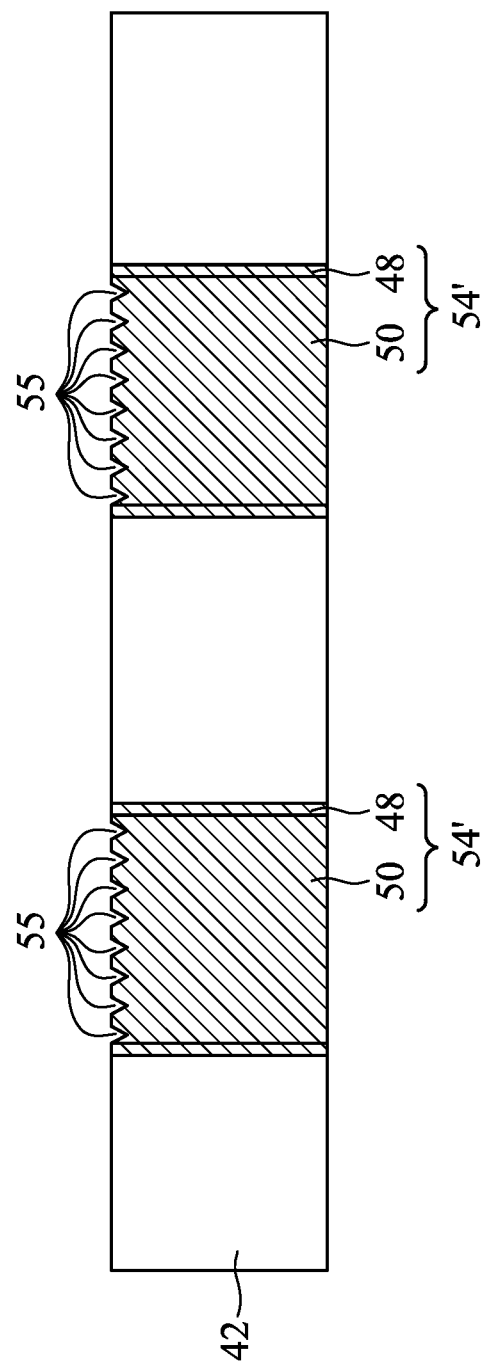

FIG. 15A illustrates a magnified cross-sectional view of parts of bond pads 54' and the corresponding dielectric layer 42 in accordance with some embodiments of the present disclosure. Each of bond pads 54' (and the underlying vias 52 as shown in FIG. 4) includes diffusion barrier 48 and metallic material 50 encircled by diffusion barrier 48. Metallic material 50 may include edge portions and a middle portion between the edge portions, with the middle portion having a top surface lower than the top surfaces of the edge portions, hence forming recesses 55. The recesses 55 may have depth D1 greater than about 0.1 µm, and the depth D1 may be in the range between about 0.1 µm and about 3 µm. FIG. 15B illustrates a similar structure, except that instead of having the dishing as shown in FIG. 15A, micro recesses 55 are formed. It is noted that dishing and micro recesses 55 may also happen at the same time and on the same structure, with the dished surface also including micro recesses.

Figure 5:
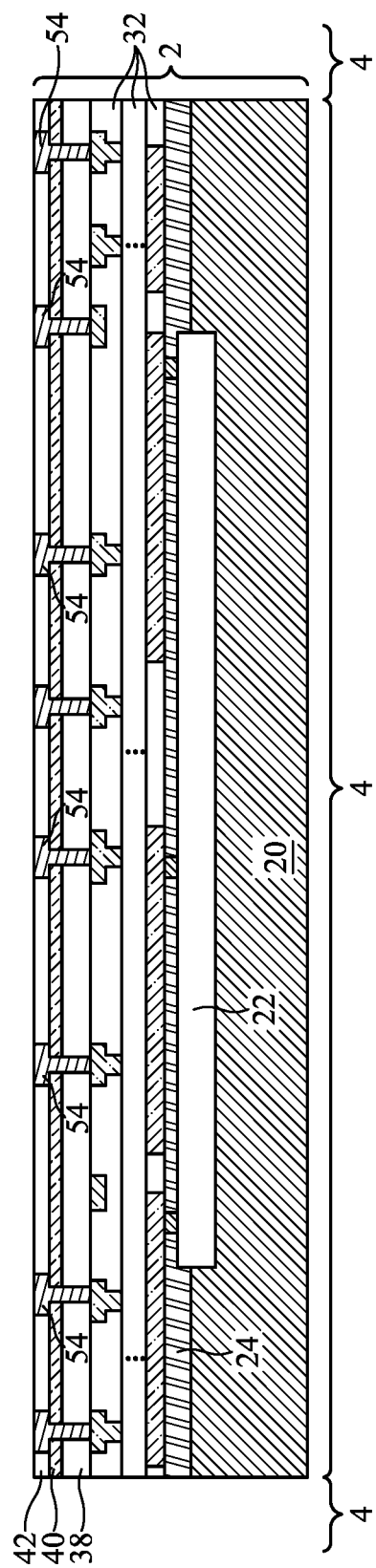
Figure 16A:
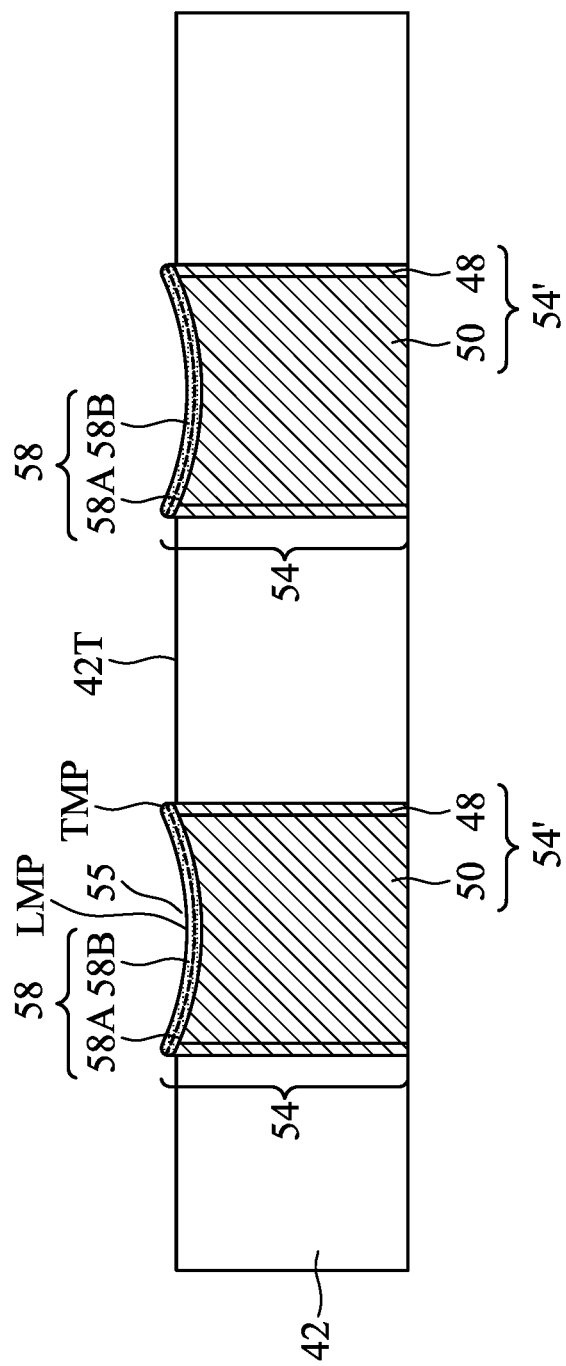

Referring to FIG. 16A, fill-in conductive layers 58 are selectively deposited on bond pads 54'. Fill-in conductive layers 58 may be formed of metal(s), and are alternatively referred to as fill-in metal layers 58. Throughout the description, bond/metal pads 54' and the respective overlying fill-in metal layers 58 are collectively referred to as bond pads 54. The respective wafer 2 is illustrated in FIG. 5, wherein the details of bond pads 54 may be found in FIG. 16A. In accordance with some embodiments, fill-in metal layers 58 are deposited using a selective deposition method such as plating, which may include Electro-Chemical Plating (ECP), electroless plating, or the like. Accordingly, fill-in metal layers 58 are selectively deposited on the metallic materials such as bond pads 54', but not on the dielectric materials such as dielectric layer 42. In accordance with some embodiments, the current density used for the plating process may be in the range between about 0.1 ASD (amps per decimeter squared) and about 5.0 ASD.

The amount of fill-in metal layers 58 deposited on each of bond pads 54 is controlled, so that fill-in metal layers 58 fill recesses 55 (FIG. 15A), with as little as excess amount as possible. The topmost point TMP of fill-in metal layers 58 may be higher than the top surface of surface dielectric layer 42. To keep the volume of fill-in metal layers 58 to be the same as the volume of the corresponding recesses 55, the lowest point LMP of the top surface of fill-in metal layers 58 may be lower than the top surface 42T of surface dielectric layer 42. Alternatively stated, recesses 55 may have small parts unfilled by fill-in metal layers 58, and the excess portions of fill-in metal layers 58 higher than surface 42T may compensate for the unfilled parts. The appropriate volume of fill-in metal layers 58 may be determined by measuring the dimensions of recesses 55 and the dimensions of bond pads 54.

Fill-in metal layers 58 may be formed of or comprise materials selected from Cu, Sn, In, Ag, SnAg, or the like, alloys thereof, and/or composite layers thereof. In accordance with some embodiments, the materials of fill-in metal layers 58 are selected according to the material of bond pads 54, so that the Coefficient of Thermal Expansion (CTE) $CTE58$ of fill-in metal layers 58 is close to the CTE $CTE54'$ of bond pads 54'. For, example, the ratio $|(CTE58-CTE54')|/CTE58$ may be smaller than about 0.2, and may be smaller than about 0.1, wherein the value $|(CTE58-CTE54')|$ is the absolute value of $(CTE58-CTE54')$. Furthermore, the CTE difference $|(CTE58-CTE54')|$ may be smaller than about $10 \times 10^{-5}/K$ at 20° C. With the CTEs $CTE58$ and $CTE54'$ being close to each other, the resulting bonding structure is less prone to the problems caused by CTE mismatch, which problems may include cracking, delamination, or the like.

In accordance with some embodiments of the present disclosure, the melting point of fill-in metal layers 58 is lower than the melting point of bond pads 54'. For example, when metal pads 54' are formed of or comprise copper, fill-in metal layers 58 may be formed of or comprise Sn, In, Ag, or the like, or alloys thereof. In accordance with some embodiments, the melting point difference (MP54'−MP58) is greater than about 100° C., greater than bout 200° C., or greater than about 500° C., wherein melting points MP54' and MP58 are the melting points of bond pads 54' and the melting points of fill-in metal layers 58, respectively. The melting point difference (MP54'−MP58) may also be in the range between about 100° C. and about 800° C.

In accordance with some embodiments, fill-in metal layers 58 are formed of a homogeneous material. In accordance with alternative embodiments, each of fill-in metal layers 58 may be a composite layer including two or more sub layers, with the sub layers formed of materials different from each other. For example, as shown in FIG. 16A, each fill-layer 58 may comprise sub layer 58A and sub layer 58B formed of different materials. In accordance with some embodiments of the present disclosure, sub layer 58A is a diffusion barrier layer, which may be formed of or comprise Ti, Ta, TiN, TaN, Ni, or the like. Sub layer 58B may be formed of Cu, Sn, In, Ag, SnAg, or the like, or alloys thereof. In accordance with alternative embodiments, Sub layers 58A and 58B are formed of materials that are different from each other, and may diffuse to each other through solid-liquid diffusion in subsequent bonding process. For example, sub layer 58A may be formed of In or Cu, while sub layer 58B may be formed of Cu (when sub layer 58A is formed of In) or In (when subs layer 58A is formed of Cu).

Figure 16B:
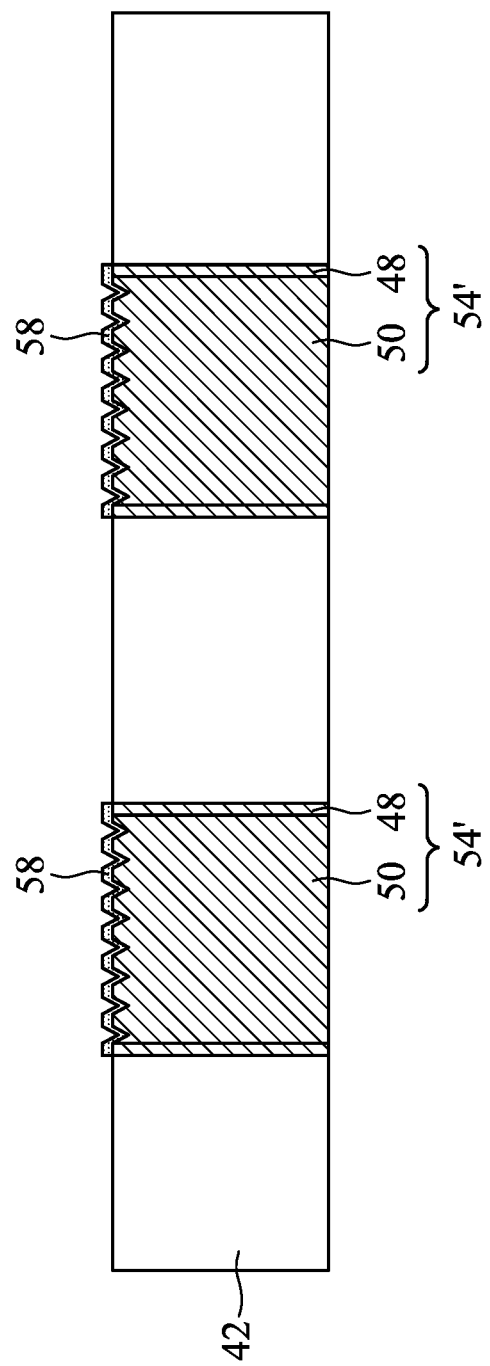

FIG. 16B illustrates fill-in metal layer 58 that fully or partially fill recesses 55 in accordance with some embodiments, wherein the recesses are micro recesses instead of dishing. Although sub layers 58A and 58B as shown in FIG. 16A are not shown separately, they may also be formed.

Referring to FIG. 5, bond pads 54, which includes bond pads 54' (not shown, refer to FIG. 16A) and the corresponding overlying fill-in metal layers 58, are illustrated.

Figure 6:
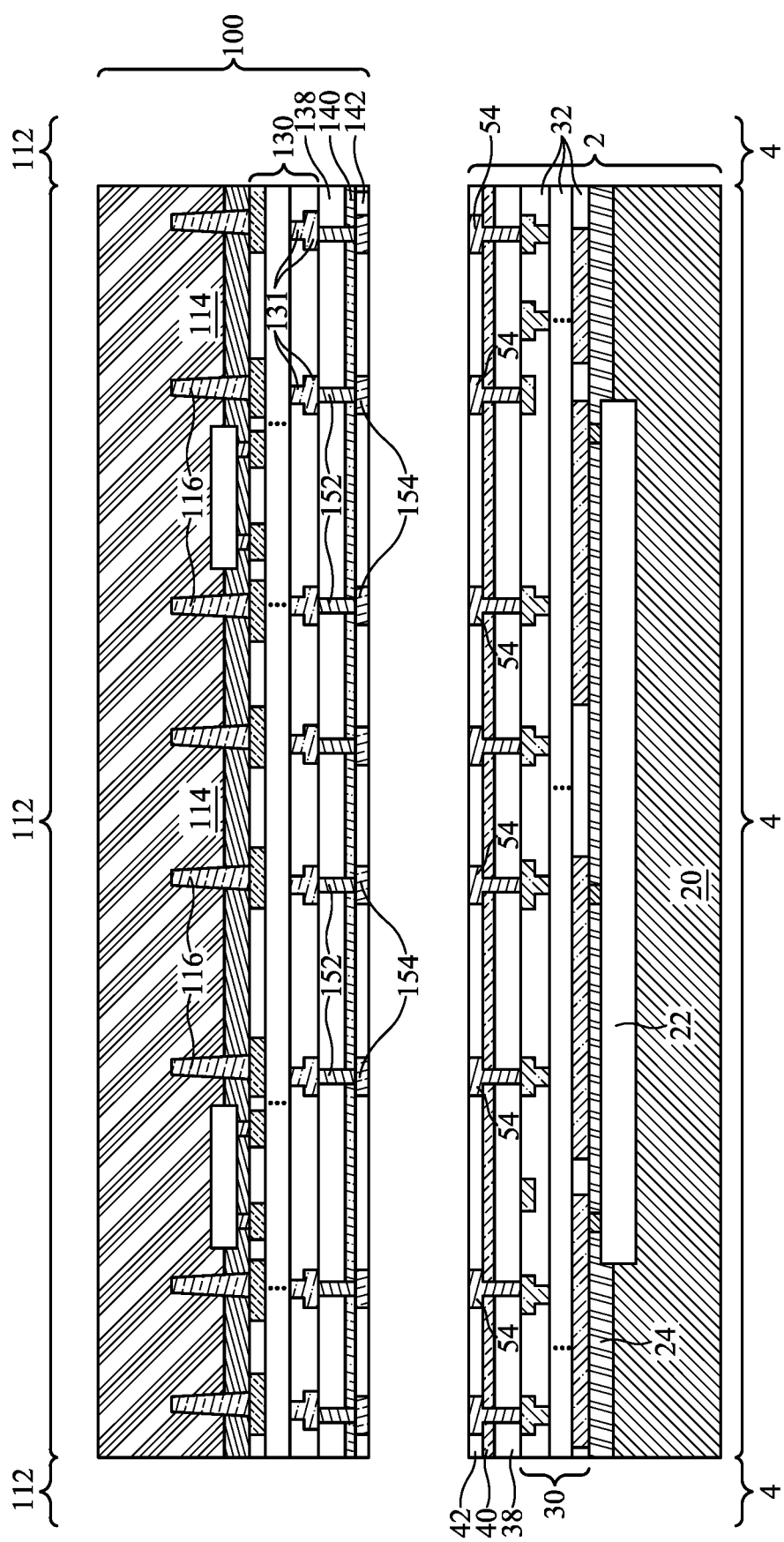

FIG. 6 illustrates the formation of wafer 100, which includes device dies 112 therein. In accordance with some embodiments of the present disclosure, device dies 112 are logic dies, which may be CPU dies, MCU dies, 10 dies, Base-Band dies, AP dies, or the like. Device dies 112 may also be memory dies. Wafer 100 includes semiconductor substrate 114, which may be a silicon substrate. Through-Silicon Vias (TSVs) 116, sometimes referred to as through-semiconductor vias or through-vias, are formed to extend into semiconductor substrate 114. TSVs 116 are used to connect the devices and metal lines formed on the front side (the illustrated bottom side) of semiconductor substrate 114 to the backside, as shown in subsequent figures. Also, device dies 112 include interconnect structures 130 for connecting to the active devices and passive devices (if any) in device dies 112. Interconnect structures 130 include metal lines and vias (not shown).

Wafer 100 may include dielectric layers 138 and 142, and etch stop layer 140 between dielectric layers 138 and 142. Bond pads 154 and vias 152 are formed in layers 138, 140, and 142. The respective process is illustrated as process 210 in the process flow 200 as shown in FIG. 19. The materials and the formation processes of dielectric layers 138 and 142, etch stop layer 140, bond pads 154, and vias 152 may be similar to their corresponding parts in device die 4, and hence the details are not repeated herein.

Figure 17:
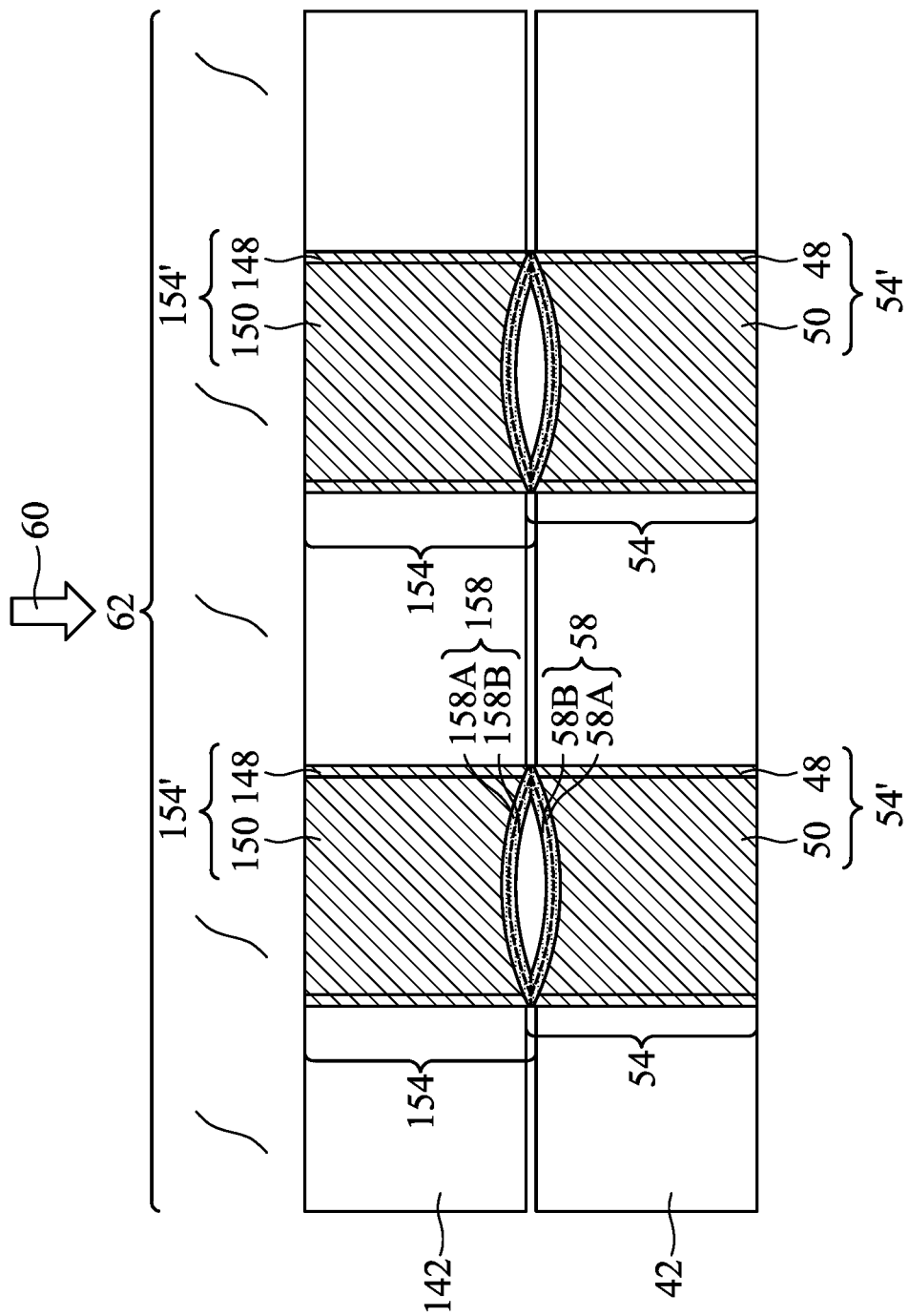

FIG. 17 illustrates an amplified view of bond pads 154 in accordance with some embodiments. Bond pads 154 include diffusion barrier 148 and metallic material 150. The structures, the materials and the formation methods of bond pads 154 and vias 152 may be similar to that of bond pads 54 and vias 52 as shown in FIG. 16A. In accordance with some embodiments, bond pads 154 include metal pads 154' and fill-in layers 158 on metal pads 154'. The formation process and the corresponding materials of fill-in layers 158 may be similar to that of fill-in metal layers 58, and are not repeated herein. In accordance with alternative embodiments, bond pads 154 include metal pads 154', and do not include fill-in layers 158. In accordance with alternative embodiments, fill-in metal layers 158 are formed on metal pads 154', while on metal pads 54', no fill-in metal layers are deposited.

Referring to FIGS. 6 and 17, wafer 100 is placed against wafer 2, with bond pads 154 aligned to corresponding bond pads 54. Wafer 100 is pressed against wafer 2, wherein the pressing process is represented by arrow 60 in FIG. 17. Wafers 2 and 100 are heated, as represented by curved lines 62 in FIG. 17. In accordance with some embodiments, the pressure is lower than about 1,000 kilogram-force per centimeter square (kgf/cm$^2$). This pressure is lower than the pressure adopted in the conventional wafer-to-wafer bonding processes. The reduction of the force is made possible by the adoption of the fill-in layers 58/158 with lower melting points. In addition, in the wafer-to-wafer bonding process, the wafer temperature may be in the range between about 100° C. and about 200° C. The bonding duration may be in the range between about 1 hour and about 2 hours.

Figure 7:
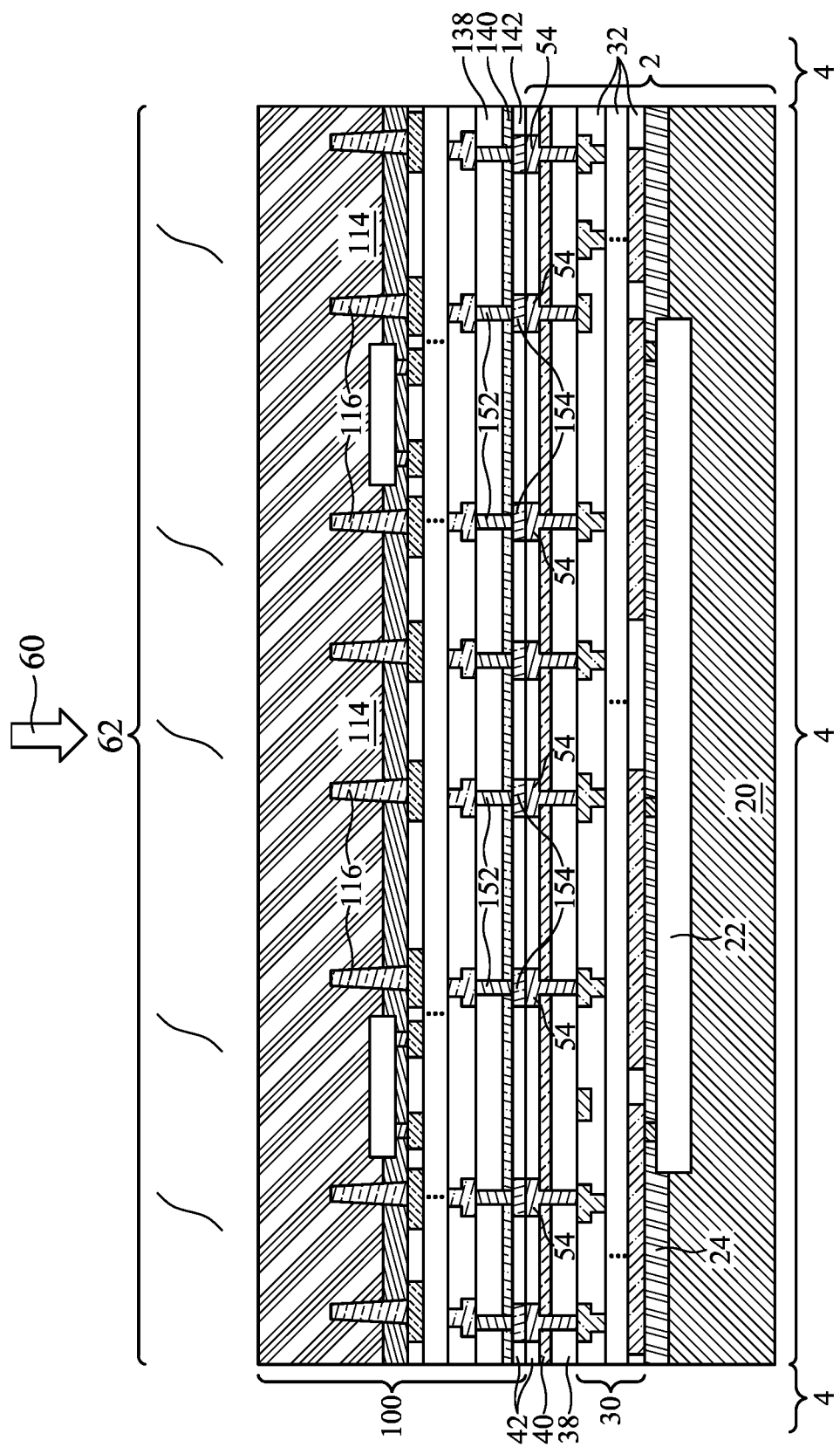

Next, as shown in FIG. 7, wafer 100 is bonded to wafer 2 through hybrid bonding. The respective process is illustrated as process 212 in the process flow 200 as shown in FIG. 19. Bond pads 154 are bonded to the respective bond pads 54 through metal-to-metal bonding, wherein bond pads 154 are bonded to bond pads 54 through inter-diffusion. Surface dielectric layer 142 in wafer 100 is bonded to surface dielectric layer 42 in wafer 2 through fusion bonding, for example, with Si—O—Si bonds formed between surface dielectric layer 142 and surface dielectric layer 42.

Figure 18A:
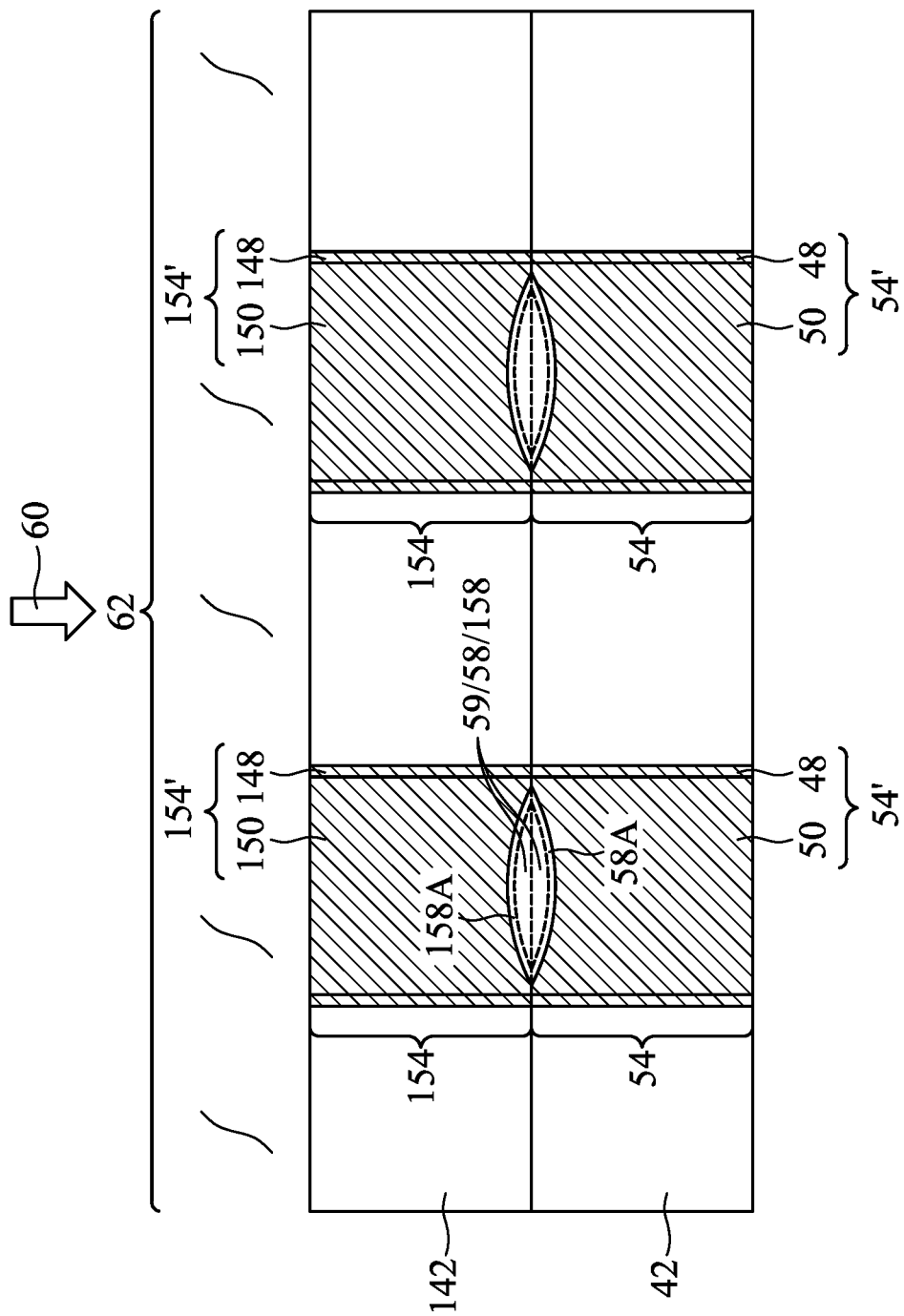

FIG. 18A illustrates the amplified view of the bonding processes as a result of the bonding process, inter-diffusion region 59 is formed. There may be, or may not be, portions of fill-in metal layers 58 and/or 158 remaining. In accordance with some embodiments, the wafer temperature during the bonding process is equal to or higher than the melting point of one or both of fill-in metal layers 58 and 158. This causes at least the partial melting or the full melting of one of or both of fill-in metal layers 58 and 158. Throughout the description, the term "partial melting" indicates the corresponding layers have mixed melted parts and un-melted parts.

As aforementioned, fill-in metal layers 58 and 158 may be single layers formed of the same material such as Cu, Sn, In Ag, SnAg, or the like. Accordingly, in the at least partial melting, the fill-in metal layers 58 (or 158) inter-diffuse, and are bonded to each other. In accordance with alternative embodiments, fill-in metal layers 58 and 158 are single layers formed of different materials. The different materials thus inter-diffuse and form an alloy. For example, in FIG. 17, the dashed line between sub layers 58A and 58B represents that layer 58 may be a single layer formed of a homogeneous material or include multiple layers, and the dashed line between sub layers 158A and 158B represents that layer 158 may be a single layer formed of a homogeneous material or include multiple layers. In accordance with yet alternative embodiments, one of the materials in one of fill-in metal layers 58 and 158 is formed of or comprises indium, which has a melting point of about 156° C. Indium thus melts or partially melts during the bonding process and diffuses into the other material (such as copper) through solid-liquid diffusion to form an alloy, wherein the alloy may be an $In_xCu_y$ alloy. The $In_xCu_y$ alloy may have a melting point higher than about 600° C., which is higher than the melting point of indium. Accordingly, the resulting alloy is more stable and may go through subsequent thermal processes, if any, without melting or breaking.

In FIG. 18A, the resulting metal layers is marked as metal layers 59/58/158 to indicate the layers between metal pads 54' and the corresponding overlying metal pads 154' may be alloy regions 59, or may include the bonded fill-in metal layers 58 and 158 (which are separate layers forming a distinguishable interface) if no alloy is formed. Metal layers 59/58/158 may also include alloy regions 59 and unmolten/unalloyed portions of metal layers 58 and/or 158.

Figure 18B:
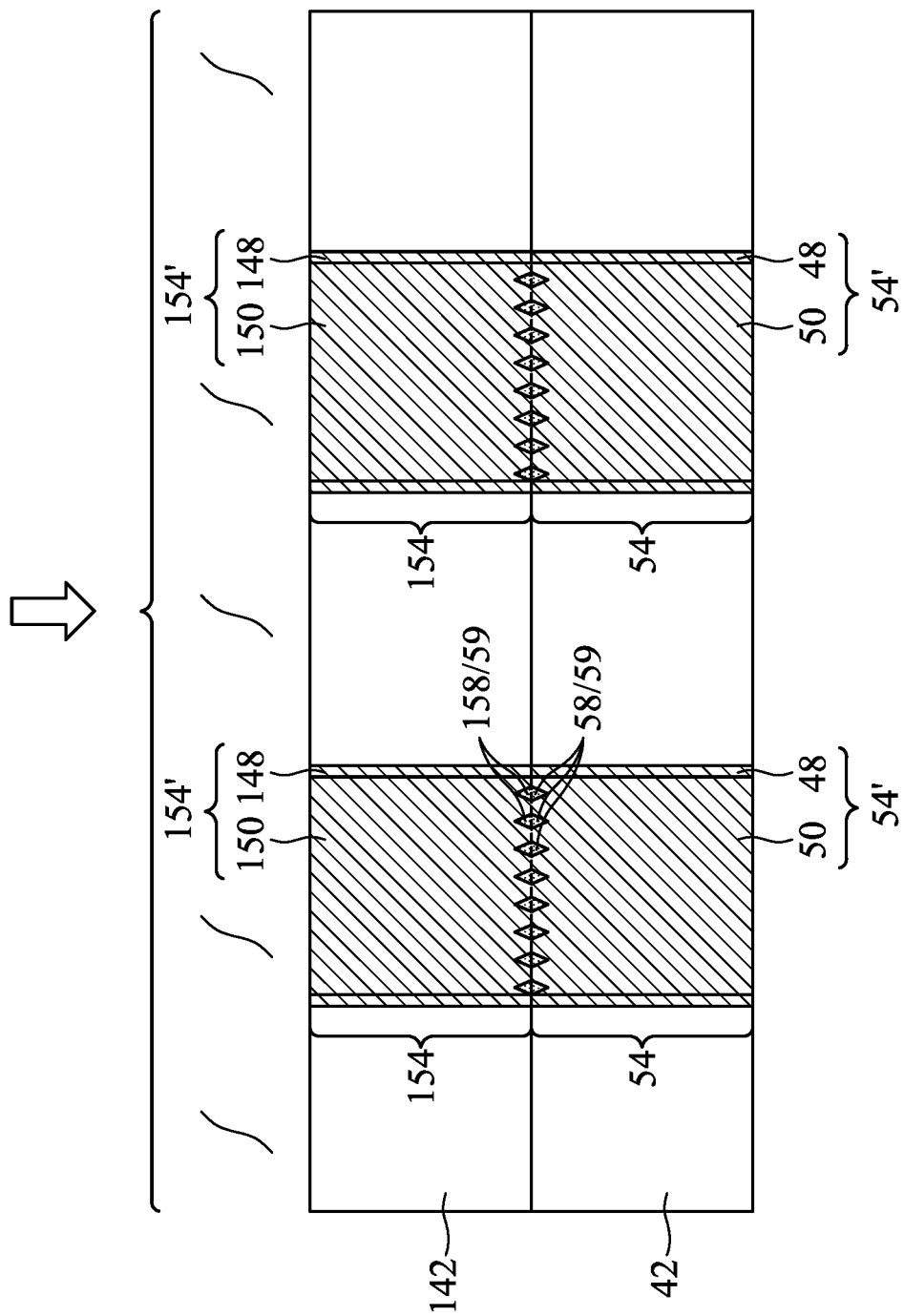

FIG. 18B illustrates the embodiments in which micro recesses are formed, and hence the fill-in metal layers 58 and 158 also have the shapes of the micro recesses. Again, fill-in metal layers 58 and 158 may form an alloy 59, or remain as separate layers (formed of different materials) that have a distinguishable interface. Metal pads 54 and 154 may be in contact with each other, as shown in FIG. 18B, or may be spaced apart from each other by fill-in metal layers 58 and 158 (if not alloyed) or alloy 59.

In accordance with some embodiments in which one or both of fill-in metal layers 58 and 158 is formed of a composite layer, the different sub layers in fill-in metal layers 58 and 158 may diffuse to each other to form an alloy. For example, in accordance with some embodiments, the top sub layer of fill-in layer 58 is formed of In, and the bottom sub layer of fill-in layer 158 is formed of Cu, which during the bonding process may form an alloy. There may also be a diffusion barrier that is not melted and alloyed. For example, in FIG. 18A, the resulting bonded regions include diffusion layer 58A and 158A, and metal layers 59/58/158 (wherein 58/158 are actually 58B/158B) in between. In accordance with alternative embodiments in which each of the diffusion layer 58 and 158 is a single layer, and alloy region 59 is formed, the alloy regions 59 may be in contact with the top surfaces of bond pad 54' and the bottom surfaces of bond pad 154'.

In accordance with some embodiments, some parts of metal pads 54' and 154' are in physical contact with and bonded to each other. For example, as shown in FIG. 18A, the edge portions of metal pads 54' and 154' are bonded to each other to form interfaces. The interface formed between a pair of metal pads 54' and 154' may form a ring in a top view of the bonding structure, with the ring encircling metal layers 59/58/158. In accordance with other embodiments, metal pads 54' and 154' are fully spaced apart from each other by metal layers 59/58/158, and are not in contact with each other. It is appreciated that due to process variations, on the same bonded wafer and in same resulting package, some of metal pads 54' and 154' may be in physical contact with and bonded to each other, while some other metal pads 54' and 154' are fully spaced apart from each other by the metal layers 59/58/158.

In accordance with alternative embodiments, one of fill-in metal layers 58 and 158 is formed for the corresponding wafers 2 and 100 (FIG. 6), and the other is not formed. Accordingly, the fill-in layer 58 or 158 fills both of the recesses in bond pads 54' and 154'.

Figure 8:
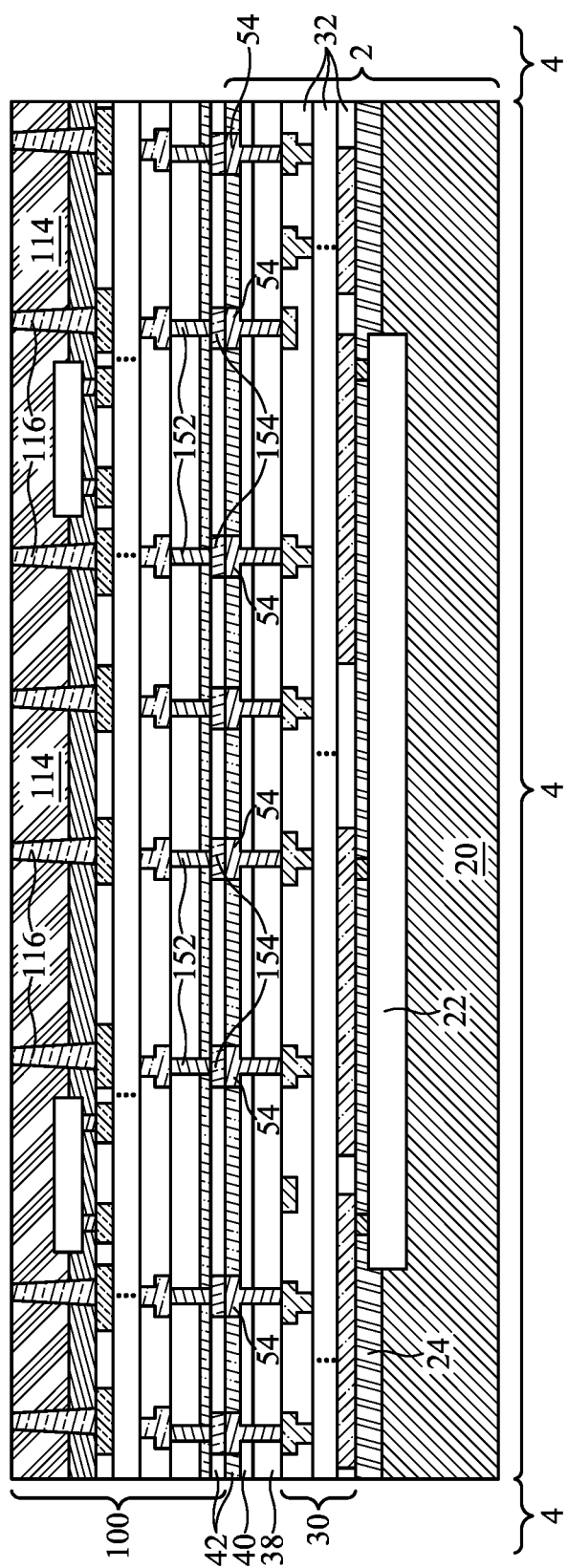
Figure 9:
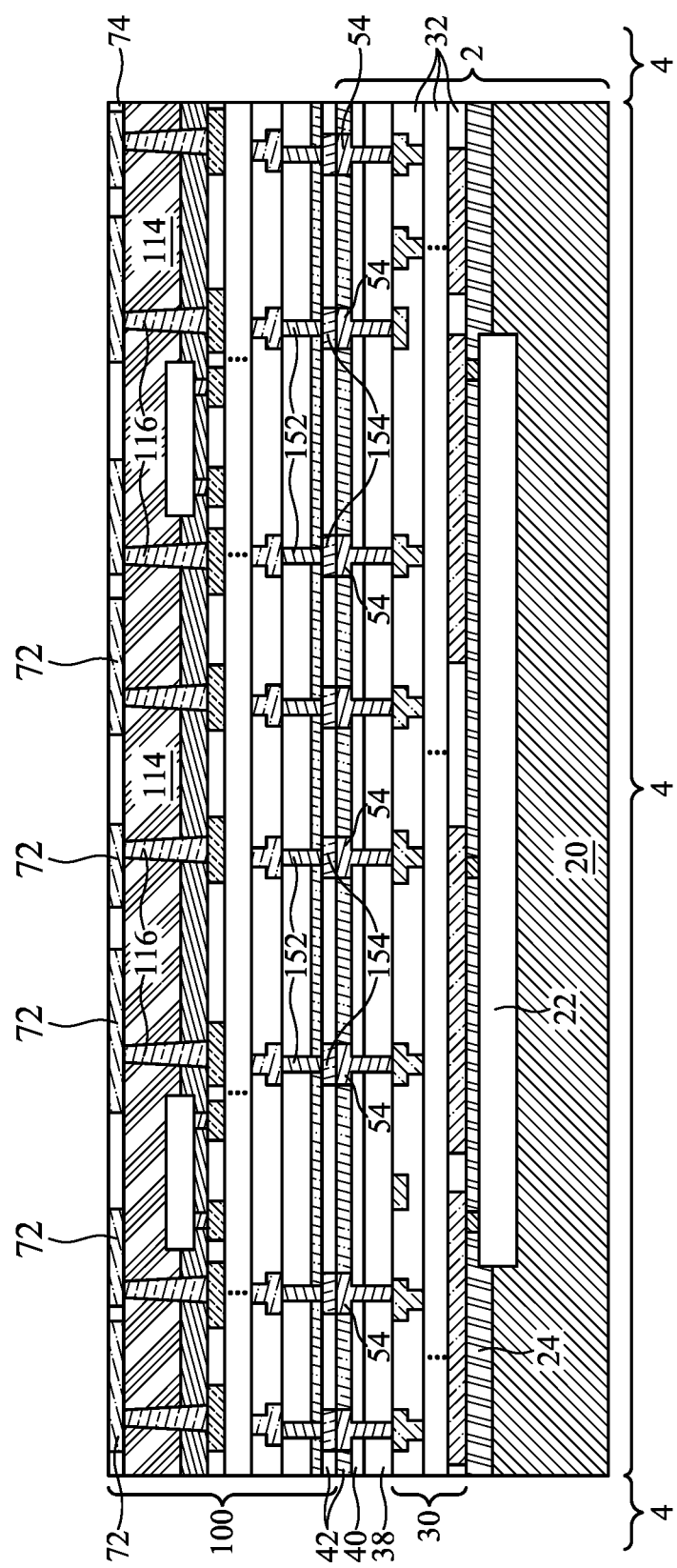

Referring to FIG. 8, in accordance with some embodiments, after the bonding process, a backside grinding may be performed to thin wafer 100, until through-vias 116 are exposed. Next, referring to FIG. 9, redistribution lines (RDLs) 72 and dielectric layer 74 are formed. The respective process is illustrated as process 214 in the process flow 200 as shown in FIG. 19. In accordance with some embodiments of the present disclosure, dielectric layer 74 is formed of an oxide such as silicon oxide, a nitride such as silicon nitride, or the like. RDLs 72 may be formed using a damascene process, which includes etching dielectric layer 74 to form openings, depositing a conductive barrier layer into the openings, plating a metallic material such as copper or a copper alloy, and performing a planarization to remove the excess portions of the metallic material.

Figure 10:
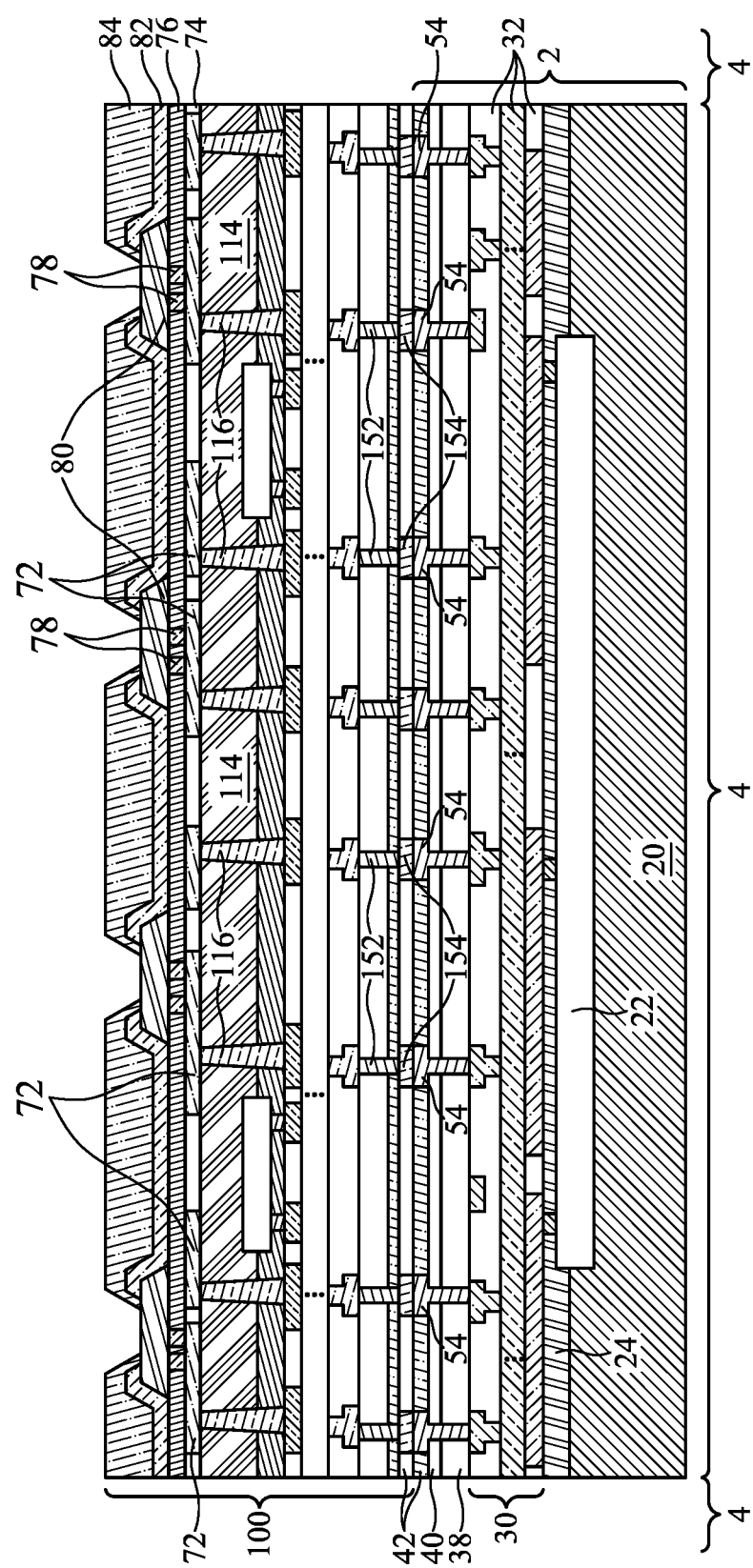

FIG. 10 illustrates the formation of passivation layers, metal pads, and overlying dielectric layers. It is appreciated that the overlying structures may take different forms than illustrated, and the illustrated structure is an example. The respective process is also illustrated as process 214 in the process flow 200 as shown in FIG. 19. Passivation layer 76 (sometimes referred to as passivation-1) is formed over dielectric layer 74, and vias 78 are formed in passivation layer 76 to electrically connect to RDLs 72. Metal pads 80 are formed over passivation layer 76, and are electrically coupled to RDLs 72 through vias 78. Metal pads 80 may be aluminum pads or aluminum-copper pads, and other metallic materials may be used.

As also shown in FIG. 10, passivation layer 82 (sometimes referred to as passivation-2) is formed over passivation layer 76. Each of passivation layers 76 and 82 may be a single layer or a composite layer, and may be formed of a non-porous material. In accordance with some embodiments of the present disclosure, one or both of passivation layers 76 and 82 is a composite layer including a silicon oxide layer and a silicon nitride layer (not shown separately) over the silicon oxide layer. Passivation layers 76 and 82 may also be formed of other non-porous dielectric materials such as Un-doped Silicate Glass (USG), silicon oxynitride, and/or the like.

Next, passivation layer 82 is patterned, so that some portions of passivation layer 82 cover the edge portions of metal pads 80, and some portions of metal pads 80 are exposed through the openings in passivation layer 82. Polymer layer 84 is then formed, and then patterned to expose metal pads 80. Polymer layer 84 may be formed of polyimide, polybenzoxazole (PBO), or the like.

Figure 11:
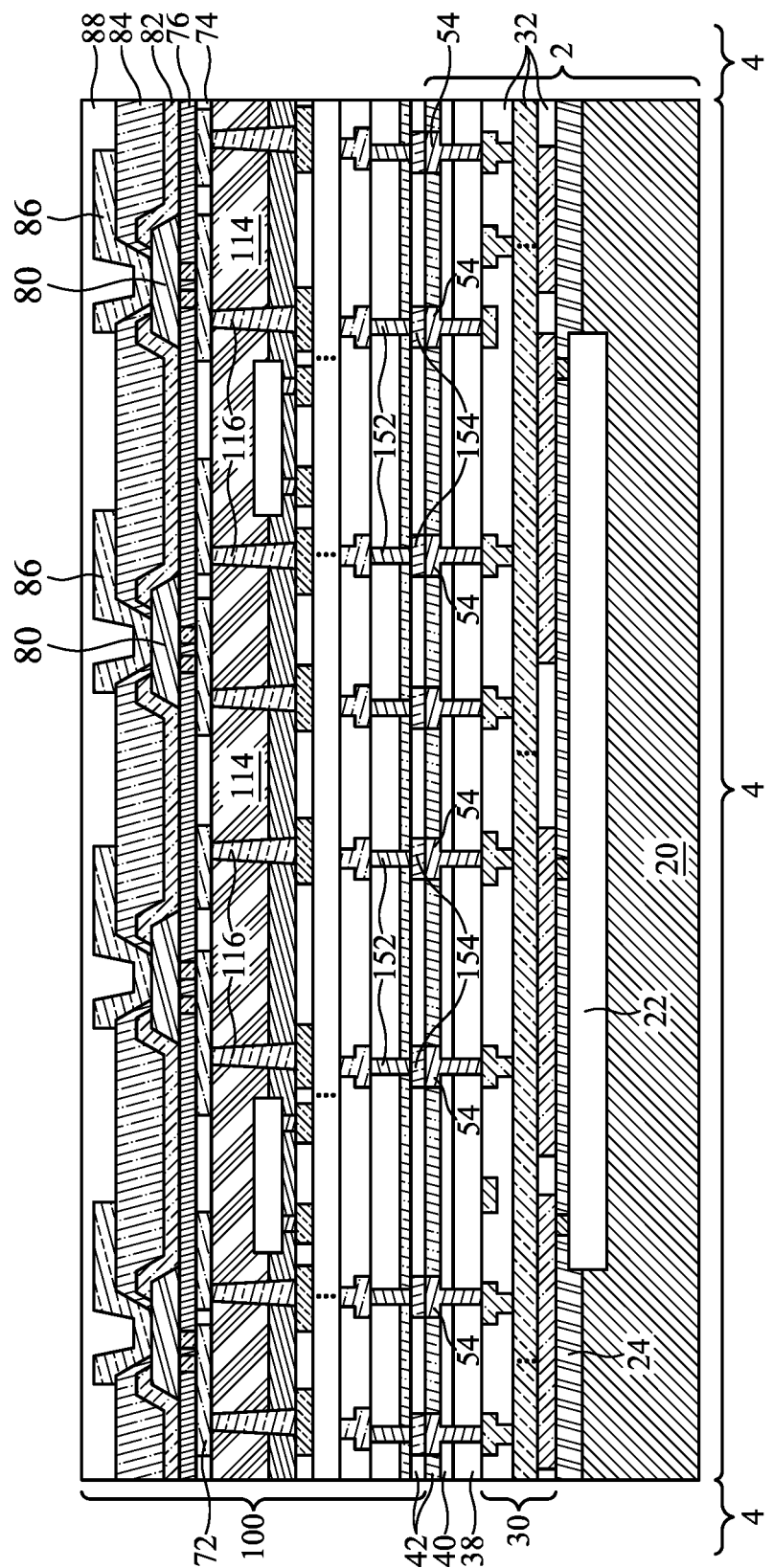
Figure 12:
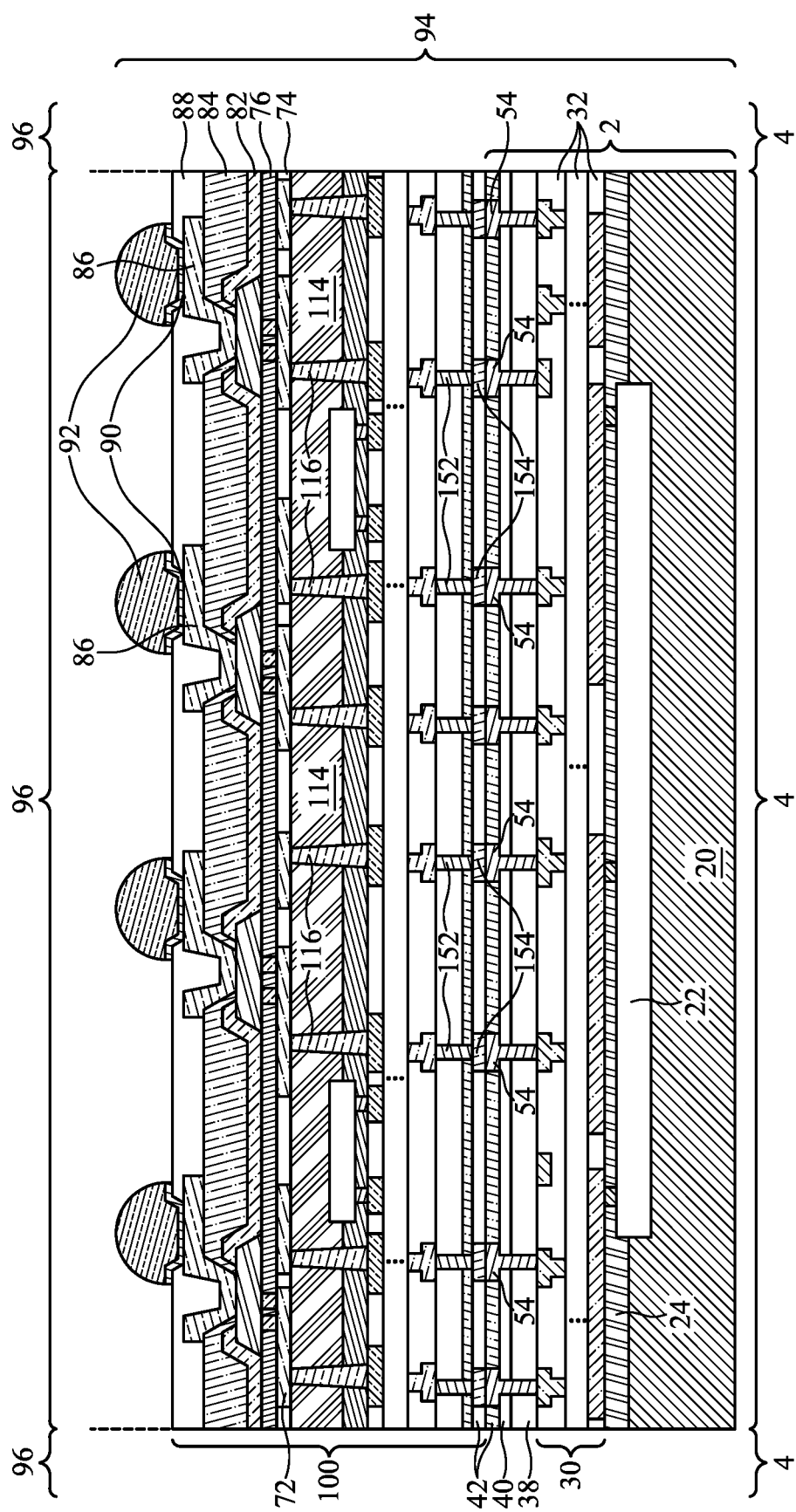

Referring to FIG. 11, Post-Passivation Interconnects (PPI) 86 are formed. The formation process may include forming a metal seed layer and a patterned mask layer (not shown) over the metal seed layer, and plating PPIs 86 in the patterned mask layer. The patterned mask layer and the portions of the metal seed layer overlapped by the patterned mask layer are then removed in etching processes. Polymer layer 88 is then formed, which may be formed of PBO, polyimide, or the like.

Referring to 12, Under-Bump Metallurgies (UBMs) 90 and electrical connectors 92 are formed. UBMs 90 and electrical connectors 92 extend into polymer layer 88 to connect to PPIs 86. In accordance with some embodiments of the present disclosure, each of UBMs 90 includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included in UBMs 90.

An formation process for forming UBMs 90 and electrical connectors 92 may include depositing a blanket UBM layer, forming and patterning a mask (which may be a photo resist, not shown), with portions of the blanket UBM layer being exposed through the opening in the mask. After the formation of UBMs 90, the illustrated package is placed into a plating solution (not shown), and a plating process is performed to form electrical connectors 92 on UBMs 90. In accordance with some embodiments of the present disclosure, electrical connectors 92 include non-solder parts (not shown), which are not molten in the subsequent reflow processes. The non-solder parts may be formed of copper, and hence are referred to as copper bumps hereinafter, although they may be formed of other non-solder materials. Each of electrical connectors 92 may also include cap layer(s) (not shown) selected from a nickel layer, a nickel alloy, a palladium layer, a gold layer, a silver layer, or multi-layers thereof. The cap layer(s) are formed over the copper bumps. Electrical connectors 92 may further include solder caps, which may be formed of a Sn—Ag alloy, a Sn—Cu alloy, a Sn—Ag—Cu alloy, or the like, and may be lead-free or lead-containing.

The structure formed in preceding steps is referred to as reconstructed wafer 94. A die-saw (singulation) step is then performed on reconstructed wafer 94 to separate reconstructed wafer 94 into a plurality of packages 96. The respective process is illustrated as process 216 in the process flow 200 as shown in FIG. 19. One of the packages 96 is shown in FIG. 13.

Figure 13:
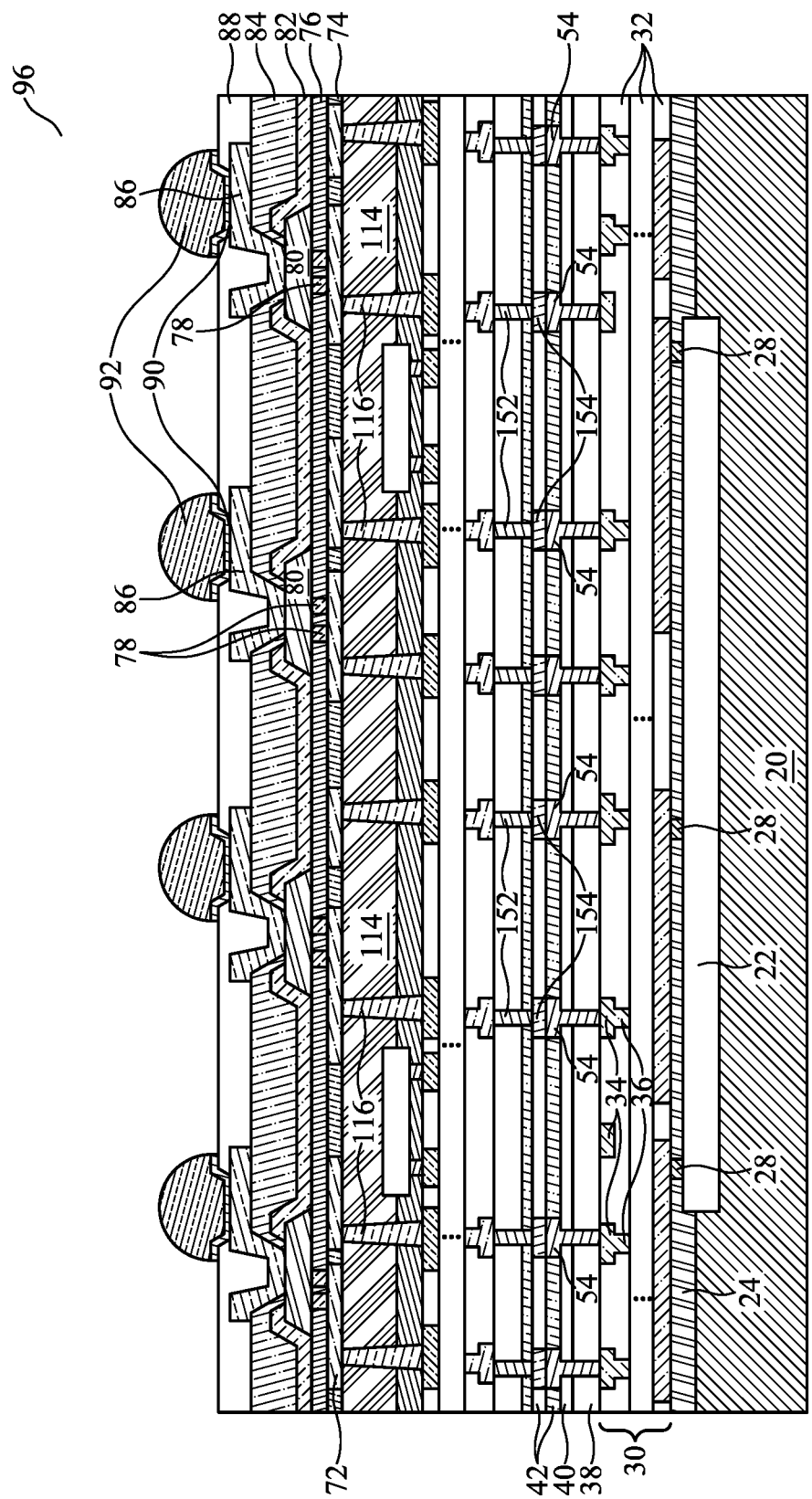
Figure 14:
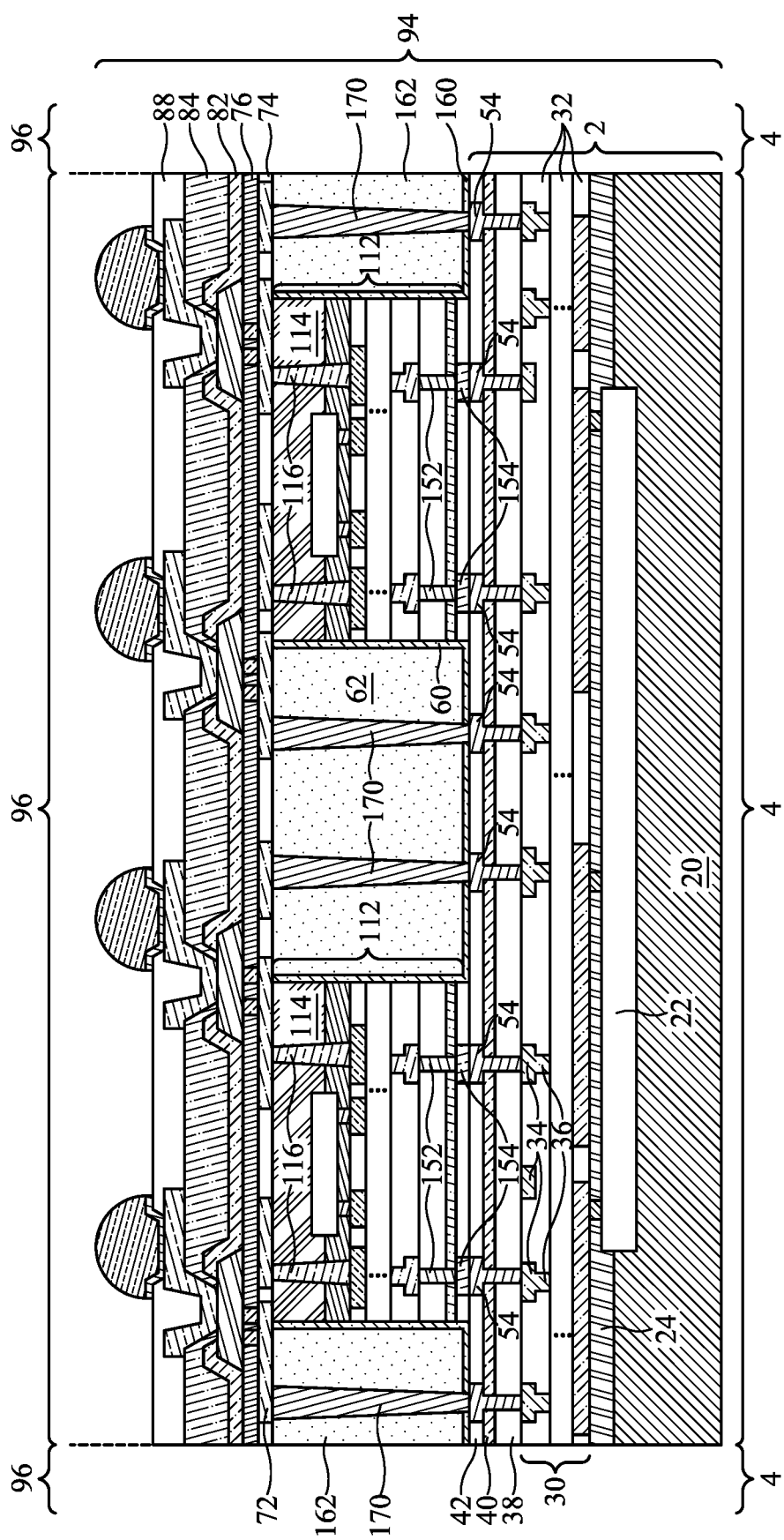
FIG. 14 is a cross-sectional view of a package component using die-to-wafer bonding in accordance with some exemplary embodiments.

The package shown in FIG. 13 is formed through a wafer-to-wafer bonding process. In accordance with alternative embodiments, the wafers and bond pads formed in accordance with the embodiments of the present disclosure may also be used in die-to-wafer bonding or die-to-die bonding processes. For example, FIG. 14 illustrates a package formed based on a die-to-wafer bonding process. In the respective formation process, device dies 112 are first sawed from the respective wafer into discrete dies, which are bonded to wafer 2 through die-to-wafer bonding. Gap-filling materials 160 and 162 are then formed to fill the gaps between device dies 112. In accordance with some embodiments, gap-filling material 160 comprises a silicon nitride layer, and gap-filling material 162 comprises an oxide such as silicon oxide. After the bonding process, a planarization process is performed to remove excess gap-filling materials 160 and 162 and to reveal through-vias 116. Next, through-vias 170 are formed to electrically connect to some of bond pads 54. It is appreciated that these bond pads 54 may have the structures as shown in FIG. 16A, and may include metal pads 54' formed of a first material, and fill-in metal layers 58 formed of a second material different from the first material. Through-vias 170 are in contact with bond pads 54, and may be in contact with fill-in metal layers 58 and/or metal pads 54' as shown in FIG. 16A. In subsequent processes, RDLs 72, dielectric layer 74, and overlying features are formed to form reconstructed wafer 94. A singulation process may be performed to saw reconstructed wafer 94 into individual packages 96.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By selectively forming fill-in conductive layers on top of bond pads, the recesses of the bond pads may be filled, and the corresponding bonding processes have better quality.

In accordance with some embodiments of the present disclosure, a method comprises forming a first package component, which formation process comprises forming a first plurality of openings in a first dielectric layer; depositing a first metallic material into the first plurality of openings; performing a planarization process on the first metallic material and the first dielectric layer to form a first plurality of metal pads in the first dielectric layer; and selectively depositing a second metallic material on the first plurality of metal pads to form a first plurality of bond pads, wherein the first plurality of bond pads comprise the first plurality of metal pads and corresponding parts of the second metallic material. The method further comprises bonding the first package component to a second package component, wherein the first plurality of bond pads are bonded to the second package component. In an embodiment, the second package component comprises a second dielectric layer, wherein the first dielectric layer is bonded to the second dielectric layer; and a second plurality of bond pads in the second dielectric layer, wherein the second plurality of bond pads are bonded to the first plurality of bond pads. In an embodiment, both of the first plurality of metal pads and the second metallic material in the first plurality of bond pads are in contact with the second plurality of bond pads. In an embodiment, in the depositing the first metallic material, the first metallic material is not deposited on exposed surfaces of the first dielectric layer. In an embodiment, the selectively depositing the second metallic material comprises depositing a first sub layer comprising a first metal; and depositing a second sub layer over the first sub layer, wherein the second sub layer comprises a second metal different from the first metal. In an embodiment, the method further comprises forming the second package component comprising forming a second plurality of openings in a second dielectric layer; depositing a third metallic material into the second plurality of openings; performing an additional planarization process on the third metallic material and the second dielectric layer to form a second plurality of metal pads in the second dielectric layer; and selectively depositing a fourth metallic material on the second plurality of metal pads to form a second plurality of bond pads, wherein the first plurality of bond pads are bonded to the second plurality of bond pads. In an embodiment, in the bonding, the second metallic material is at least partially molten. In an embodiment, in the bonding, the second metallic material forms an alloy with a material of a second plurality of bond pads in the second package component. In an embodiment, the second metallic material has a first melting point lower than a second melting point of the material of the second plurality of bond pads. In an embodiment, the selectively depositing the second metallic material comprises a plating process. In an embodiment, the bonding is performed with a temperature of the first package component and the second package component being lower than about 200° C., with the second metallic material being molten in the bonding.

In accordance with some embodiments of the present disclosure, a package comprises a first package component, which comprises a first dielectric layer; a first metal pad in the first dielectric layer, wherein the first metal pad comprises a first metallic material; and a fill-in metal layer extending from a top surface of the first dielectric layer into the first metal pad, wherein the fill-in metal layer comprises a second metallic material different from the first metallic material. In an embodiment, the first metallic material has a first melting point, and the second metallic material has a second melting point lower than the first melting point. In an embodiment, the second melting point is lower than about 200° C. In an embodiment, the package further comprises a diffusion barrier between the fill-in metal layer and the first metal pad. In an embodiment, the package further comprises a second package component comprising a second dielectric layer bonded to the first dielectric layer; and a second metal pad in the second dielectric layer and bonded to the first metal pad, wherein the fill-in metal layer further extends into the second metal pad.

In accordance with some embodiments of the present disclosure, a package includes a first package component and a second package component. The first package component comprises a first dielectric layer; and a first metal pad in the first dielectric layer, wherein the first metal pad comprises a first metallic material. The second package component comprises a second dielectric layer bonded to the first dielectric layer; and a second metal pad in the second dielectric layer, wherein the second metal pad comprises a second metallic material; and a metal layer extending into the first metal pad, wherein the metal layer comprises an alloy, and the alloy comprises a third metallic material different from the first metallic material, and the metal layer is between the first metal pad and the second metal pad. In an embodiment, the first metal pad has a dishing recess, and the metal layer extends into the dishing recess. In an embodiment, the first metal pad is physically bonded to the second metal pad. In an embodiment, the first metal pad is physically separated from the second metal pad by the metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a package component comprising:
a dielectric layer;
a metal pad in the dielectric layer, wherein the metal pad comprises a first metallic material; and
a fill-in metal layer extending from a top surface of the dielectric layer into the metal pad, wherein the fill-in metal layer comprises a second metallic material different from the first metallic material, and wherein the fill-in metal layer comprises:
a plurality of higher portions, with one of the plurality of higher portions being higher than the top surface of the dielectric layer; and
a plurality of lower portions, with one of the plurality of lower portions being lower than the top surface of the dielectric layer, wherein the plurality of higher portions and the plurality of lower portions are positioned alternatingly, and are interconnected to form the fill-in metal layer that is continuous.

2. The package of claim 1, wherein the first metallic material has a first melting point, and the second metallic material has a second melting point lower than the first melting point.

3. The package of claim 2, wherein the second melting point is lower than about 200° C.

4. The package of claim 1 further comprising a diffusion barrier between the fill-in metal layer and the metal pad.

5. The package of claim 1, wherein the second metallic material comprises indium.

6. The package of claim 5, wherein the second metallic material comprises an alloy of indium and copper, wherein an entirety of the fill-in metal layer comprises the alloy of indium and copper.

7. The package of claim 1, wherein the metal pad comprises a plurality of micro recesses separated from each other, wherein the plurality of lower portions of the fill-in metal layer extend into the plurality of micro recesses.

8. The package of claim 1, wherein the fill-in metal layer comprises:
a first layer formed of a first metal; and
a second layer formed of a second metal different from the first metal.

9. The package of claim 1, wherein the fill-in metal layer comprises silver.

10. The package of claim 1, wherein the fill-in metal layer is formed of a homogenous material.

11. A package comprising:
a first package component comprising:
a first dielectric layer; and
a first metal pad in the first dielectric layer, wherein the first metal pad comprises a first metallic material;
a second package component comprising:
a second dielectric layer bonded to the first dielectric layer; and
a second metal pad in the second dielectric layer, wherein the second metal pad comprises a second metallic material, wherein the first metal pad is physically bonded to the second metal pad to form a plurality of horizontal interfaces; and
a metal layer extending into the first metal pad, wherein the metal layer comprises an alloy, and the alloy comprises a third metallic material different from the first metallic material, and the metal layer is between the first metal pad and the second metal pad, and wherein the alloy comprises a plurality of portions separated from each other by the plurality of horizontal interfaces.

12. The package of claim 11, wherein the first metal pad has a dishing recess, and the metal layer extends into the dishing recess.

13. The package of claim 11, wherein one of the plurality of portions of the alloy extends into both of the first metal pad and the second metal pad.

14. The package of claim 11, wherein one of the horizontal interfaces extends to an edge of the first metal pad.

15. A package comprising:
a first package component comprising:
a first dielectric layer; and
a first metal pad in the first dielectric layer;
a second package component comprising:
a second dielectric layer bonded to the first dielectric layer; and a second metal pad in the second dielectric layer, wherein the second metal pad is physically joined to the first metal pad to form an interface; and a metal layer between the first metal pad and the second metal pad, wherein the metal layer comprises an alloy, and wherein the metal layer comprises a plurality of discrete portions separated from each other by portions of the first metal pad and the second metal pad.

16. The package of claim 15, wherein the first dielectric layer is bonded to the second dielectric layer through fusion bonding.

17. The package of claim 15, wherein the metal layer comprises a plurality of sub layers formed of different materials.

18. The package of claim 17, wherein the metal layer comprises:

a first sub layer contacting the first metal pad, wherein the first sub layer comprises a first metal;

a second sub layer contacting the second metal pad, wherein the second sub layer comprises a second metal; and an alloy layer between the first sub layer and the second sub layer, wherein the alloy layer comprises both of the first metal and the second metal.

19. The package of claim 15, wherein the interface comprises portions on opposite sides of the metal layer.

20. The package of claim 19, wherein the interface extends to an edge of the first metal pad.

* * * * *